(12) United States Patent
Pang et al.

(10) Patent No.: US 9,831,118 B1
(45) Date of Patent: Nov. 28, 2017

(54) REDUCING NEIGHBORING WORD LINE INTERFERENCE USING LOW-K OXIDE

(71) Applicant: SanDisk Technologies LLC, Plano, TX (US)

(72) Inventors: Liang Pang, Fremont, CA (US); Yingda Dong, San Jose, CA (US); Jayavel Pachamuthu, San Jose, CA (US); Ching-Huang Lu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/163,236

(22) Filed: May 24, 2016

(51) Int. Cl.
| | | |
|---|---|---|
| H01L 21/768 | (2006.01) |
| H01L 27/115 | (2017.01) |
| H01L 23/532 | (2006.01) |
| H01L 21/28 | (2006.01) |
| H01L 23/528 | (2006.01) |
| H01L 23/522 | (2006.01) |
| H01L 27/1157 | (2017.01) |
| H01L 27/11582 | (2017.01) |

(52) U.S. Cl.
CPC .... *H01L 21/7682* (2013.01); *H01L 21/28282* (2013.01); *H01L 21/76816* (2013.01); *H01L 21/76877* (2013.01); *H01L 23/528* (2013.01); *H01L 23/5226* (2013.01); *H01L 23/5329* (2013.01); *H01L 27/1157* (2013.01); *H01L 27/11582* (2013.01)

(58) Field of Classification Search
None
See application file for complete search history.

(56) References Cited

U.S. PATENT DOCUMENTS

| | | |
|---|---|---|
| 6,410,462 B1 | 6/2002 | Yang et al. |
| 8,283,228 B2 | 10/2012 | Alsmeier |
| 8,658,499 B2 * | 2/2014 | Makala ............ H01L 21/28273 257/314 |

(Continued)

OTHER PUBLICATIONS

International Search Report & The Written Opinion of the International Searching Authority dated May 3, 2017, International Application No. PCT/US2017/018550.

*Primary Examiner* — William Coleman
*Assistant Examiner* — Kien Ly
(74) *Attorney, Agent, or Firm* — Vierra Magen Marcus LLP

(57) ABSTRACT

Techniques for fabricating a memory device which has reduced neighboring word line interference, and a corresponding memory device. The memory device comprises a stack of alternating conductive and dielectric layers, where the conductive layers form word lines or control gates of memory cells. In one aspect, the memory device is provided with a reduced dielectric constant (k) in locations of a fringing electric field of the control gate. For example, portions of the dielectric layers can be replaced with a low-k material. One approach involves recessing the dielectric layer and providing a low-k material in the recess. Another approach involves doping a portion of the blocking oxide layer to reduce its dielectric constant. Another approach involves removing a portion of the blocking oxide layer. In another aspect, the memory device is provided with an increased dielectric constant adjacent to the control gates.

20 Claims, 23 Drawing Sheets

(56) References Cited

U.S. PATENT DOCUMENTS

| | | | |
|---|---|---|---|
| 8,932,674 B2 | 1/2015 | Dussarrat et al. | |
| 2011/0294290 A1 | 12/2011 | Nakanishi et al. | |
| 2012/0001264 A1* | 1/2012 | Kim | C09K 13/04 257/368 |
| 2012/0256247 A1 | 10/2012 | Alsmeier | |
| 2013/0264631 A1 | 10/2013 | Alsmeier et al. | |
| 2014/0134824 A1* | 5/2014 | Chen | H01L 21/76819 438/424 |
| 2015/0041879 A1 | 2/2015 | Jayanti et al. | |
| 2015/0179499 A1* | 6/2015 | Yang | H01L 21/76807 257/751 |
| 2015/0263126 A1* | 9/2015 | Shingu | H01L 29/518 257/321 |
| 2015/0311112 A1* | 10/2015 | Fukuo | H01L 21/76802 257/773 |
| 2015/0357342 A1* | 12/2015 | Lee | H01L 21/28282 257/324 |
| 2016/0086972 A1 | 3/2016 | Zhang et al. | |
| 2016/0093390 A1 | 3/2016 | Yuan et al. | |

\* cited by examiner

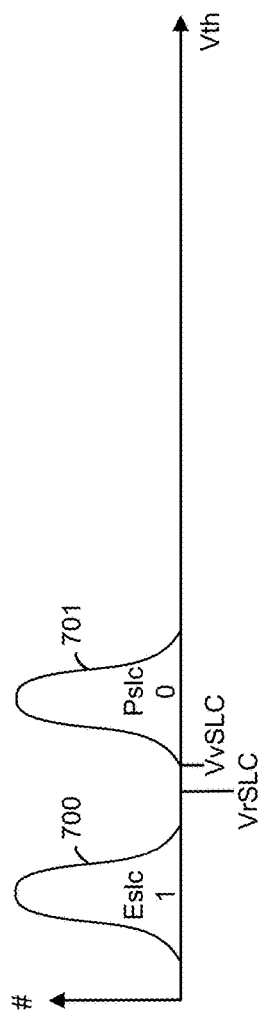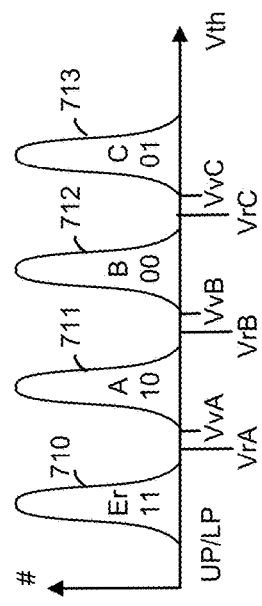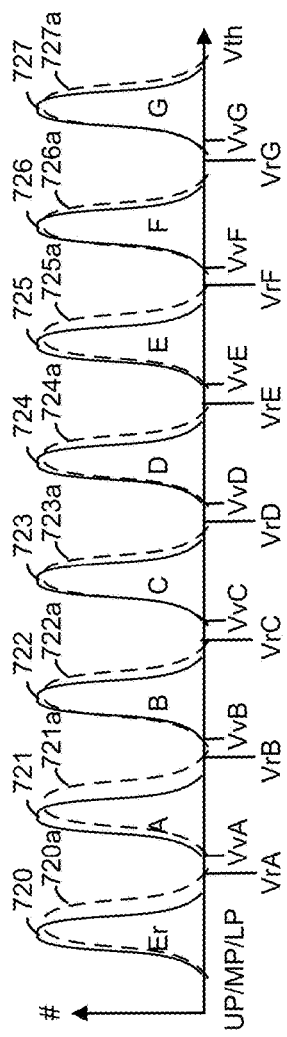

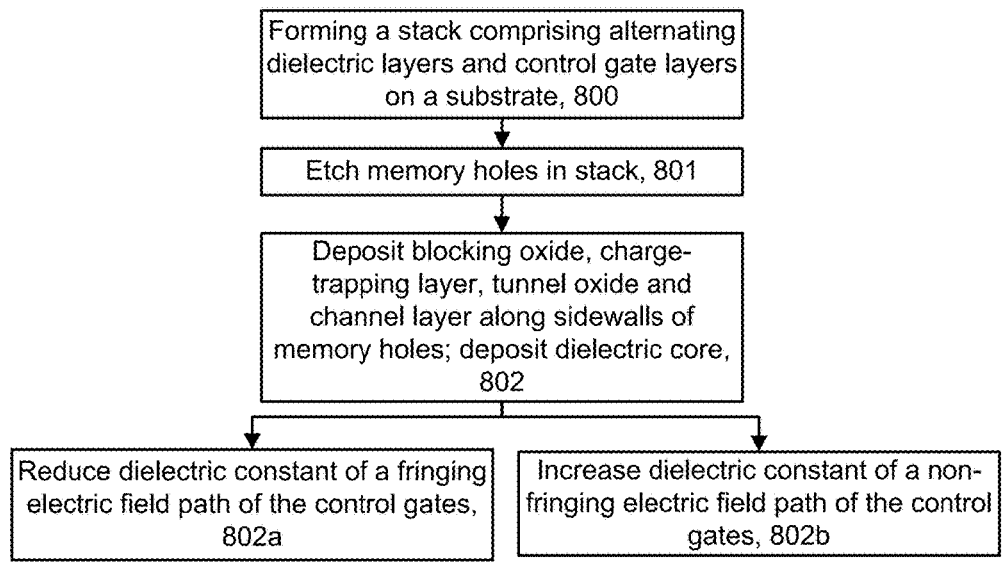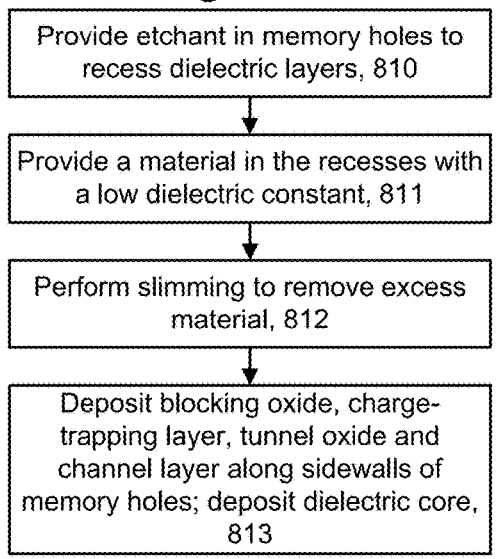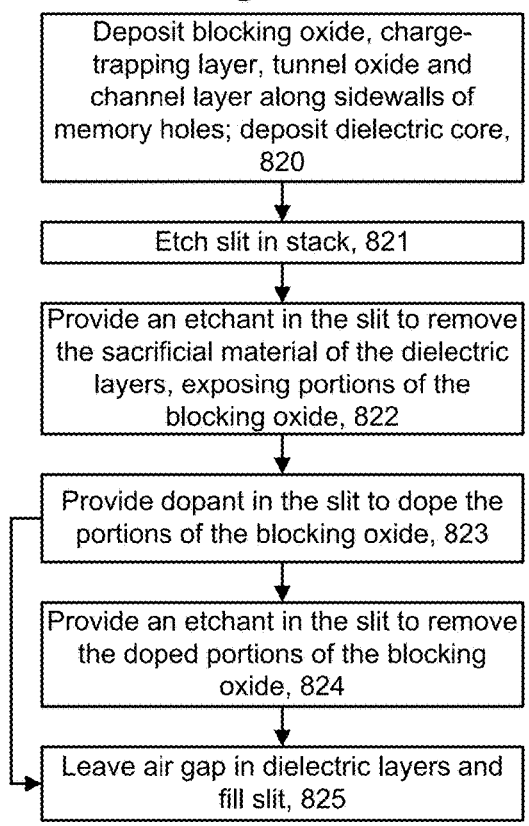

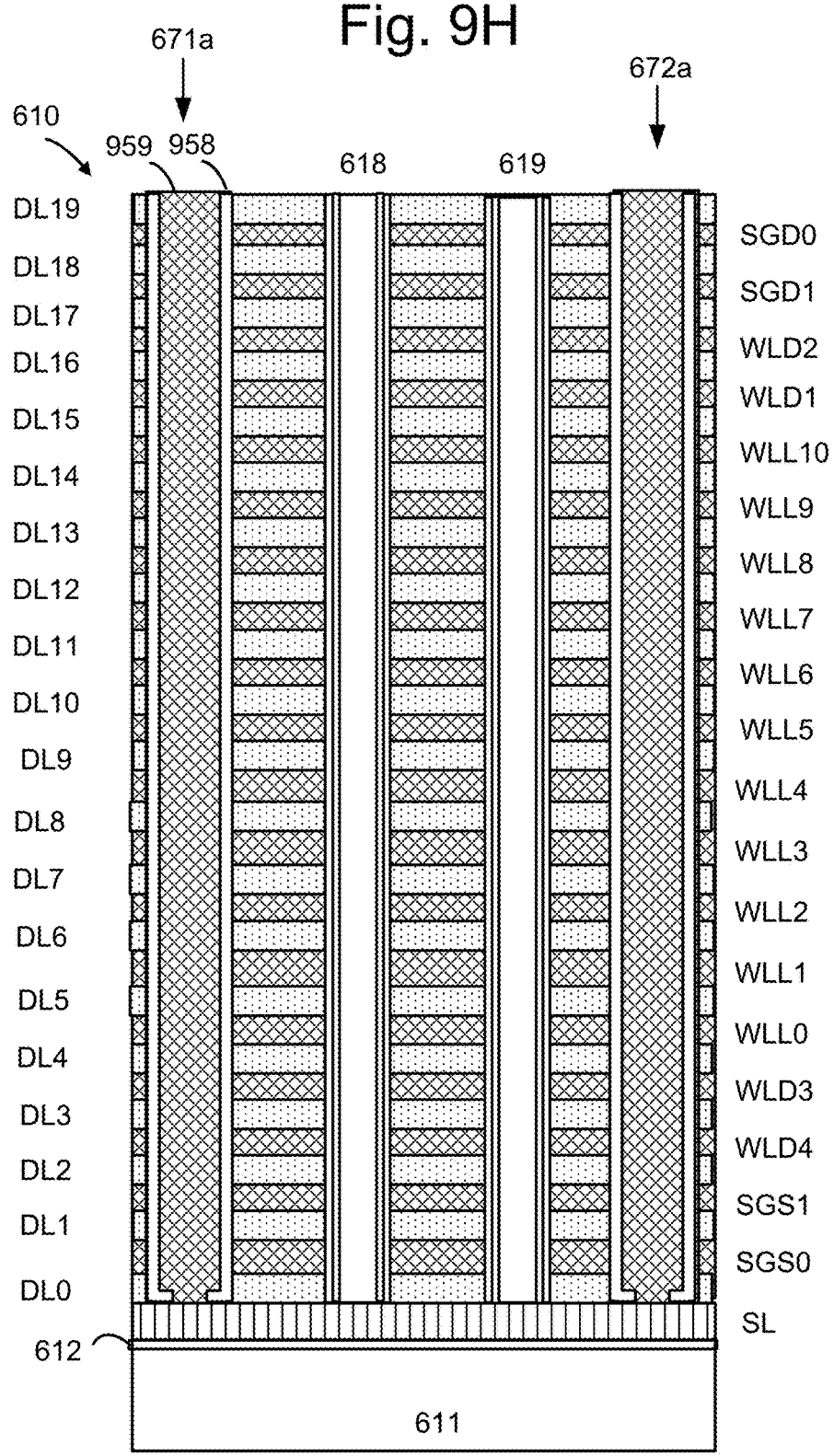

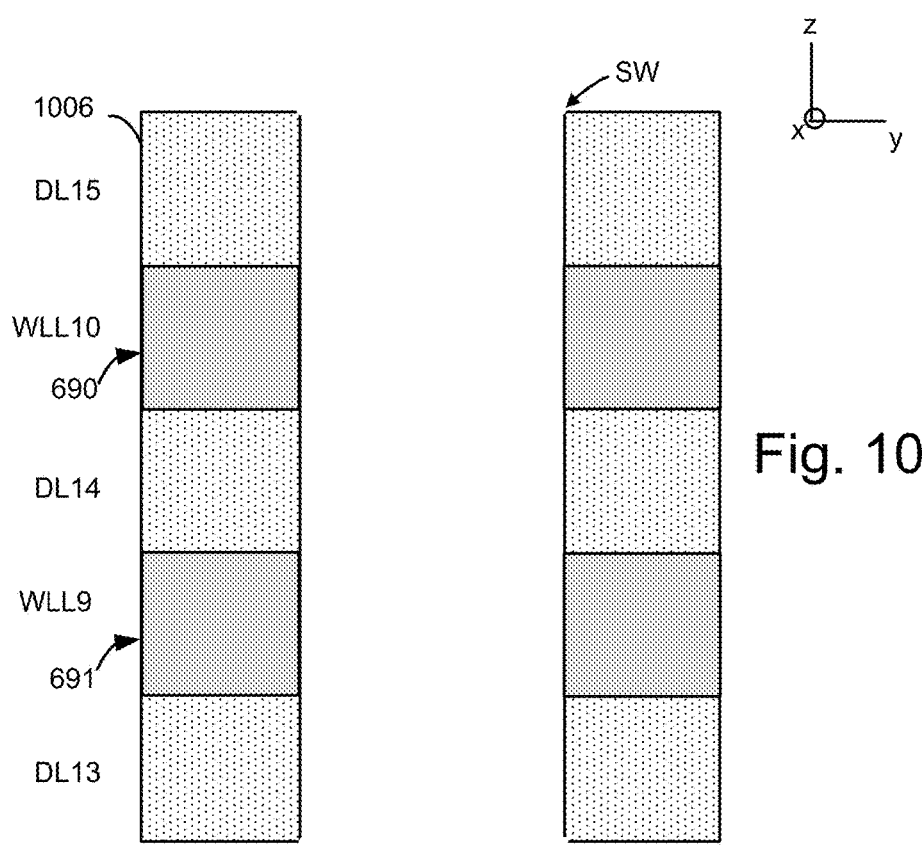

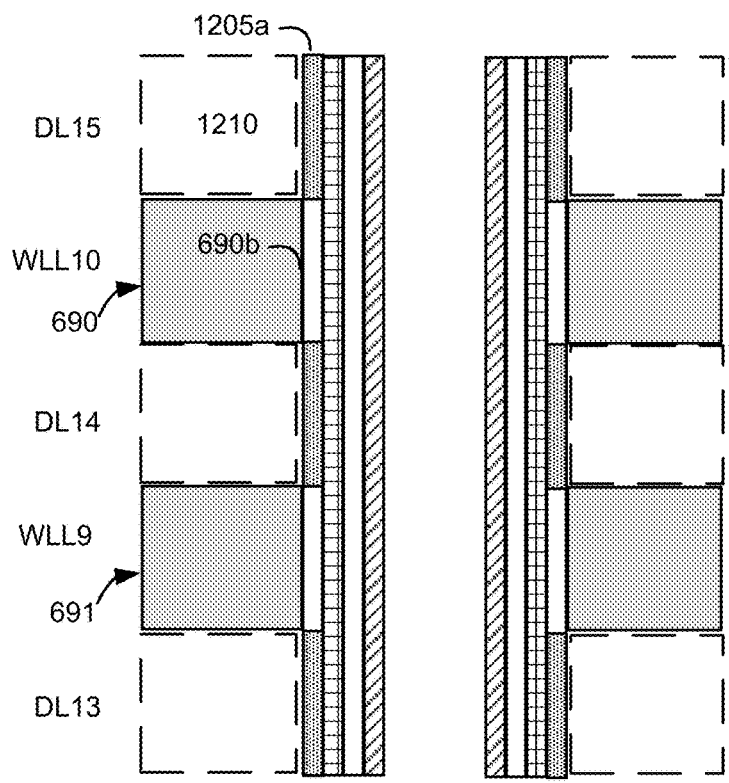
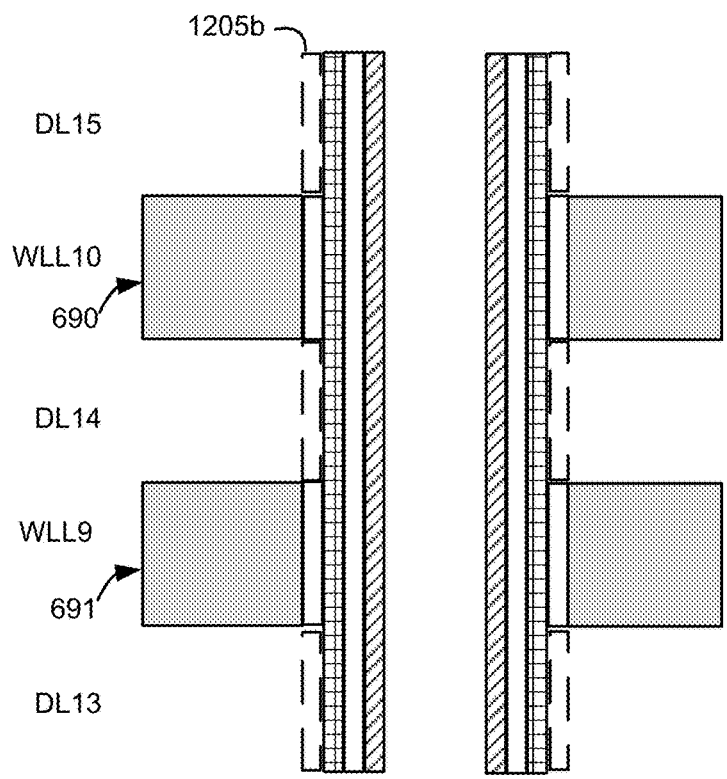

US 9,831,118 B1

REDUCING NEIGHBORING WORD LINE INTERFERENCE USING LOW-K OXIDE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 7A depicts example Vth distributions of memory cells, where two data states are used.

FIG. 7B depicts example Vth distributions of memory cells, where four data states are used.

FIG. 7C depicts example Vth distributions of memory cells, where eight data states are used.

FIG. 8A depicts an example process for fabricating a memory device with reduced neighboring word line interference.

FIG. 8B depicts an example process consistent with step 802a of FIG. 8A.

FIG. 8C depicts another example process consistent with step 802a of FIG. 8A.

FIG. 9H depicts an example cross-sectional view of the stack of FIG. 9G after cleaning and filling in the slit.

FIG. 10A depicts the region 950 of the stack of FIG. 9B.

FIG. 12C depicts the region of the stack of FIG. 12B after the doping step 823 of FIG. 8C.

FIG. 12D depicts the region of the stack of FIG. 12C after the etching step 824 of FIG. 8C.

DETAILED DESCRIPTION

Figure 1:
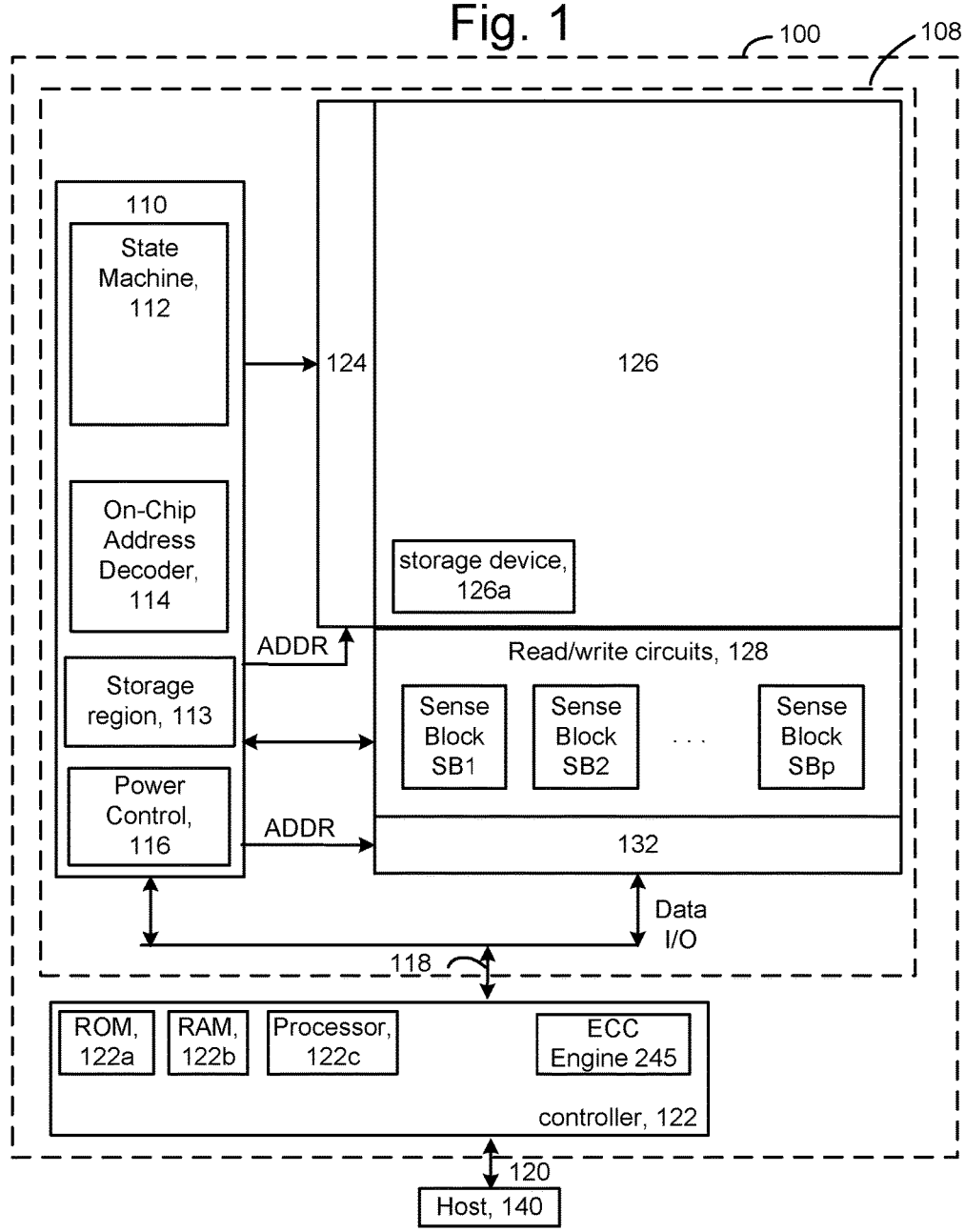
FIG. 1 is a block diagram of an example memory device.

Techniques are provided for fabricating a memory device which has reduced neighboring word line interference. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 7A). In a two-bit per cell memory device, there are four data states including the erased state and three higher data states referred to as the A, B and C data states (see FIG. 7B). In a three-bit per cell memory device, there are eight data states including the erased state and seven higher data states referred to as the A, B, C, D, E, F and G data states (see FIG. 7C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 7D) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

In one approach, the memory device comprises a stack of alternating conductive and dielectric layers, where the conductive layers form word lines or control gates of memory cells. The memory cells may be in strings which extend vertically in the stack. Further, the memory cells may be formed by an annular layers of blocking oxide, charge-trapping material, tunnel oxide and channel polysilicon which extend in the stack. The layers may be arranged concentrically. When a program voltage is applied to a one of the word lines, and a pass voltage is applied to unselected word lines, an electric field is created which draws electrons from the channel layer into a portion of the charge-trapping material which is adjacent to the word line. When the amount of charge corresponds to a desired data state, the programming is completed. However, the electric field includes a fringing or lateral component which can draw electrons from the channel layer into a portion of the charge-trapping material which is between word lines. These electrons form a parasitic cell which does not store data. As different word lines are used for programming in the device, additional parasitic cells can be formed. The parasitic cells interfere with the ability to accurately program the cells and result in widened Vth distributions.

In particular, for a cell of a given word line WLn, the programming of the cell of the next word line WLn+1 will increase the Vth of the cell of WLn. Moreover, the increase is proportional to the amount by which the data state (Vth) of the cell of WLn+1 exceeds the data state (Vth) of the cell of WLn. The most interference or upshift in Vth will be experienced by a low state cell on WLn when there is a high state cell on WLn+1. Moreover, this problem will become worse as memory devices are scaled down in size.

Techniques provided herein address the above and other issues. In one aspect, the memory device is provided with a reduced dielectric constant (k) in locations of the fringing electric field. For example, portions of the dielectric layers can be replaced with a low-k material. One approach involves recessing the dielectric layer and providing a low-k material in the recess. Another approach involves doping a portion of the blocking oxide layer to reduce its dielectric constant. Another approach involves removing a portion of the blocking oxide layer. In another aspect, the memory device is provided with an increased dielectric constant in locations of the non-fringing electric field, e.g., adjacent to the control gates and spanning a height of the control gates. One approach involves recessing a sacrificial material of the control gate layer and providing a high-k material in the recess. The above approaches can be combined as well. For example, the material with the high dielectric constant may be provided in the control gates while the material with the low dielectric constant is provided in the dielectric layers.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates.

The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for program and read parameters as described further below.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 15. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
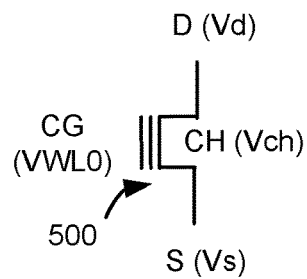
FIG. 2 depicts an example memory cell 500.

FIG. 2 depicts an example memory cell 500. The memory cell comprises a control gate CG which receives a word line voltage Vw110, a drain at a voltage Vd, a source at a voltage Vs and a channel at a voltage Vch.

Figure 3:
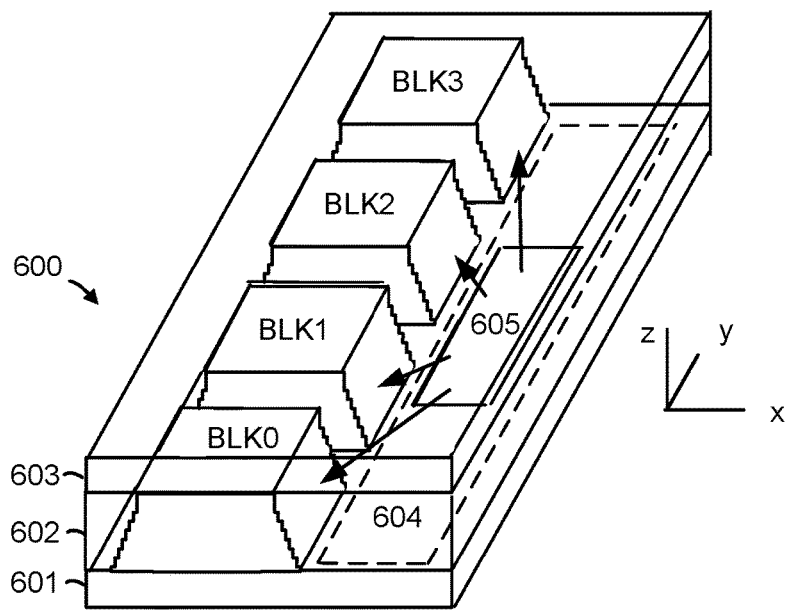
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
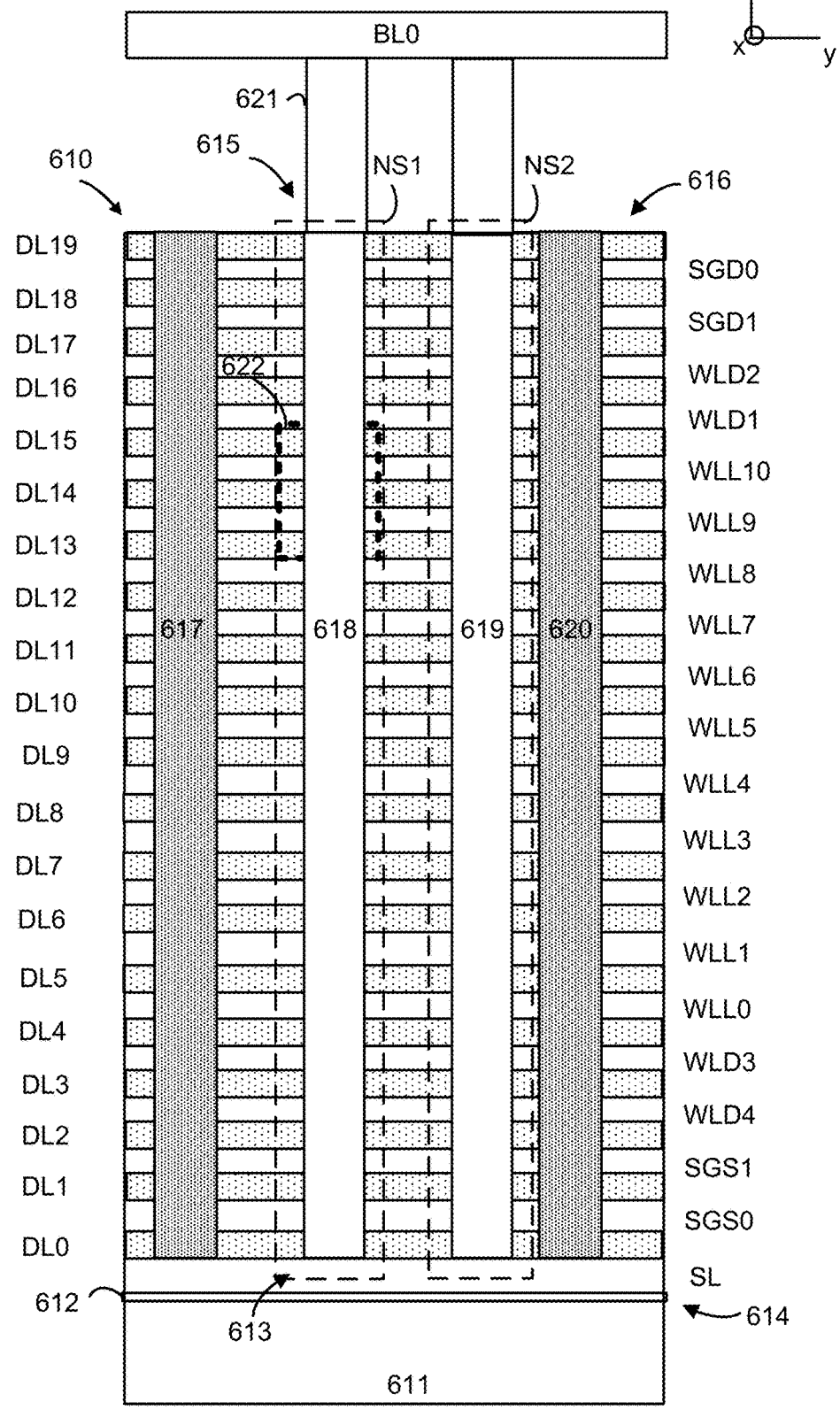
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 5:
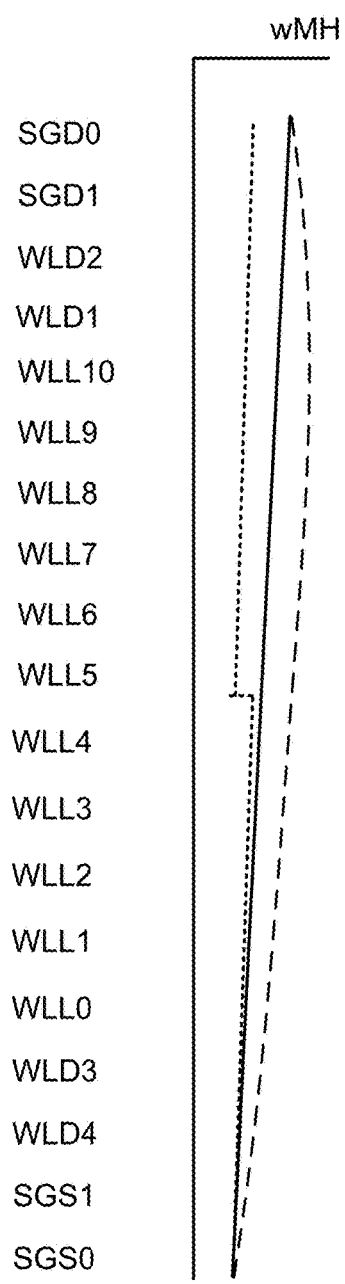
FIG. 5 depicts a plot of memory hole diameter in the stack of FIG. 4.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
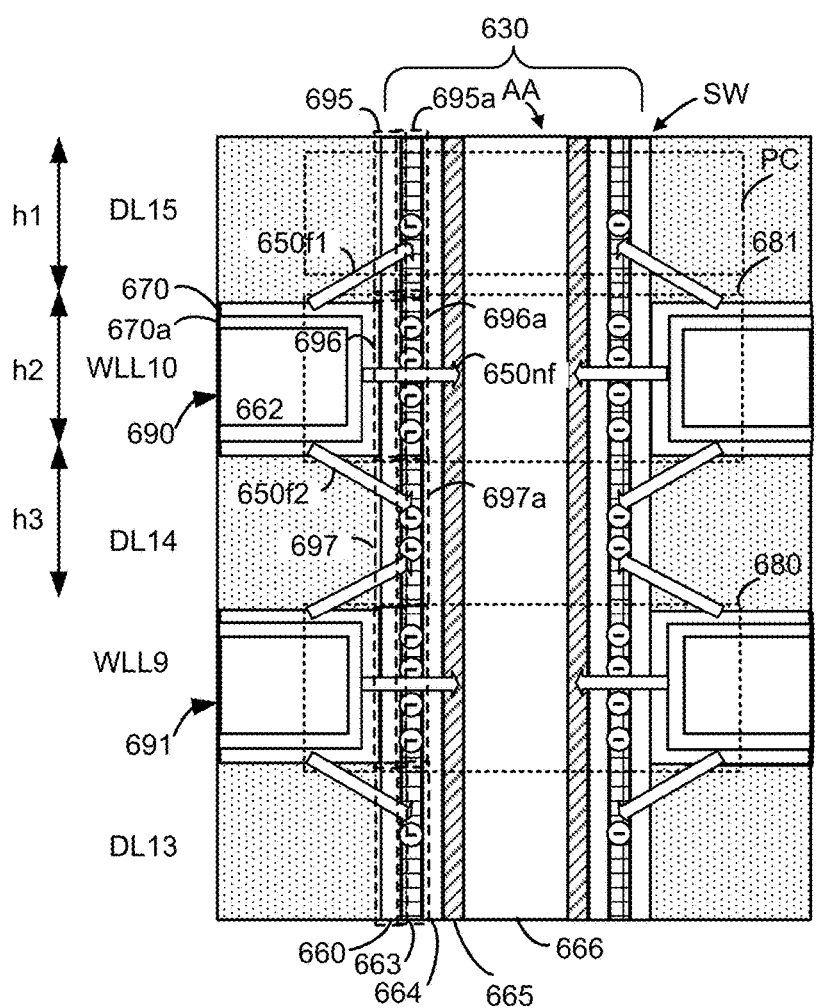
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. For example, memory cells 680 and 681 are formed in WLL9 and WLL10, respectively. The memory cells are formed from films which are deposited along the sidewall (SW) of the memory hole 630 and/or within each word line layer, e.g., using atomic layer deposition. For example, each column (e.g., the pillar which is formed by the materials within a memory hole) can include a blocking oxide layer 660, charge-trapping layer 663 such as SiN or other nitride, a tunneling oxide layer 664, a channel layer 665 (e.g., comprising polysilicon), and a dielectric core 666. The blocking oxide may comprises a continuous oxide layer such as silicon dioxide (SiO2) along the sidewall, in one approach. The charge-trapping layer, tunneling oxide layer and channel may also comprise continuous layers along the sidewall, in one approach.

A word line layer can include a metal barrier 670a (e.g., TiN, TaN, a nitride based metal barrier layer or a non-nitride metal barrier layer such as Ti or CoW) and a conductive metal 662 (e.g., W, Co, Ti, Ru or Ta) as a control gate. For example, control gates 691 and 690 are provided in WLL9 and WLL10, respectively. A word line layer can also include a high-k block oxide 670 such as A10. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

The blocking oxide layer 660 includes portions which are adjacent to, and span a height of, the control gate layers and the dielectric layers. For example, the blocking oxide layer includes portions 695, 696 and 697 which are adjacent to, and span a height h1, h2 and h3 of, DL15, WLL10 and DL14, respectively. The height is along the vertical or z-axis. Similarly, the charge-trapping layer 663 includes portions which are adjacent to, and span a height of, the control gate layers and the dielectric layers. For example, the charge-trapping layer includes portions 695a, 696a and 697a which are adjacent to, and span a height of, DL15, WLL10 and DL14, respectively, and to portions 695, 696 and 697, respectively.

During programming, an electric field is created by the program voltage which is applied to the control gate of a selected word line and by the pass voltage which is applied to the control gates of unselected word lines. For the control gate 690, the electric field includes a fringing electric field path 650/1 which passes through the portion 695 of the blocking oxide layer and the portion 695a of the charge-trapping layer, a non-fringing electric field path 650nf which passes through the portion 696 of the blocking oxide layer and the portion 696a of the charge-trapping layer, and a fringing electric field path 650/2 which passes through the portion 697 of the blocking oxide layer and the portion 697a of the charge-trapping layer. Corresponding electric field portions are also depicted for WLL9. Electrons are represented by circles with a horizontal line. Electrons are drawn into the portion 696a by the fringing electric field path 650nf to program the memory cell 681. However, a smaller but still detectable number of electrons are also drawn into the portions 695a and 697a by the non fringing electric field paths 650/1 and 650/2, respectively, resulting in corresponding parasitic cells, e.g., parasitic cell PC. It is also possible for electrons which are in portions of the charge-trapping layer adjacent to the word lines, e.g., in the portion 696a, to move laterally in the charge-trapping layer to portions of the charge-trapping layer adjacent to the dielectric layers, e.g., portions 695a and 697a, also contributing to the parasitic cells. When the memory cells 680 or 681 are sensed, such as during a read operation or program-verify operation, the parasitic cells will result in a resistance which distorts the sensing and can cause program disturb.

The severity of the problem of parasitic cells depends on the strength of the fringing electric field. By using low-k material in the path of the fringing electric field, the strength of the fringing electric field can be reduced. The strength of the fringing electric field which penetrates into the charge-trapping layer and the channel is also reduced so that the problem of parasitic cells become less severe. The low-k material has a larger effective oxide thickness and can therefore do a better job of blocking the fringing electric field.

As shown, each of the memory holes can be filled with a plurality of annular layers comprising a blocking oxide layer, a charge-trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 700 represents an erased state (Eslc) and a Vth distribution 701 represents a programmed data state (Pslc), in an example of single-level cell (SLC) programming. The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the expected upper tail of the Vth distribution of the lower state and the expected lower tail of the Vth distribution of the higher state.

FIG. 7B depicts example Vth distributions of memory cells, where four data states are used. The data states are represented by Vth distributions 710, 711, 712 and 713 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

FIG. 7C depicts example Vth distributions of memory cells, where eight data states are used. The verify voltages of the A, B, C, D, E, F and G states are VvA, VvB, VvC, VvD, VvE, VvF and VvG, respectively. A first set of read voltages for the A, B, C, D, E, F and G states includes VrA, VrB, VrC, VrD, VrE, VrF and VrG, respectively. For the A, B, C, D, E, F and G states, an example encoding of bits for each state is 111, 110, 100, 000, 010, 011, 001 and 101, respectively. The ideal data states are represented by Vth distributions 720, 721, 722, 723, 724, 725, 726 and 727 for the Er, A, B, C, D, E, F and G states, respectively. When the parasitic cells are present, the Vth distributions are widened. In this case, the data states are represented by Vth distributions 720a, 721a, 722a, 723a, 724a, 725a, 726a and 727a for the Er, A, B, C, D, E, F and G states, respectively. As mentioned, the lower states experience a relatively larger upshift in Vth.

Figure 7D:
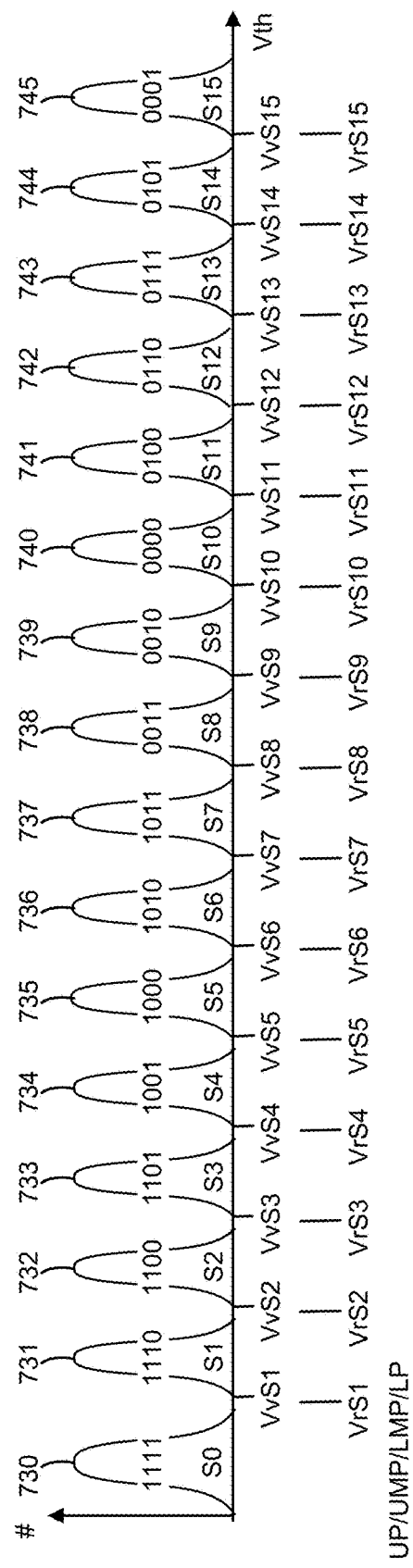
FIG. 7D depicts example Vth distributions of memory cells, where sixteen data states are used.

FIG. 7D depicts example Vth distributions of memory cells, where sixteen data states are used. Programming using four bits per cell (16 levels) can involve lower, lower-middle, upper-middle and upper pages. The data states are represented by Vth distributions 730, 731, 732, 733, 734, 735, 736, 737, 738, 739, 740, 741, 742, 743, 744 and 745 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

FIG. 8A depicts an example process for fabricating a memory device with reduced neighboring word line interference. Step 800 includes forming a stack comprising alternating dielectric layers and control gate layers on a substrate. In one approach, the control gate layers initially comprise a sacrificial material such as SiN. See, e.g., FIG. 9A. Step 801 includes etching memory holes in the stack. See, e.g., FIG. 9B. Step 802 includes depositing, in turn, a blocking oxide, a charge-trapping layer, a tunnel oxide and a channel layer along the sidewalls of the memory holes. See, e.g., FIG. 9C. A dielectric core such as SiO2 is also provided to fill a remainder of the memory holes. Step 802a includes reducing a dielectric constant of a fringing electric field path of the control gates. Step 802b includes increasing a dielectric constant of a fringing electric field path of the control gates. Steps 802a and/or 802b may be used. In one approach, steps 802a and/or 802b are performed concurrently, at least in part, with step 802.

FIG. 8B depicts an example process consistent with step 802a of FIG. 8A. Step 810 includes providing an etchant in the memory holes to recess the dielectric layers. See, e.g., FIG. 10B. Step 811 includes providing a material in the recesses with a low dielectric constant. See, e.g., FIG. 10B. In one approach, a low dielectric constant (k) is k<3.9, where 3.9 is the dielectric constant of SiO2 which may be used for the blocking oxide layer. The material in the recess has a lower k than the material which it replaces. In one approach, k<=2.0. The material can be deposited conformally using ALD.

Examples of materials which have a low dielectric constant include oxide derivatives, organic materials and highly porous oxides. Oxide derivatives include F-doped oxides deposited, e.g., using chemical vapor deposition (CVD) and having k=3.3-3.9, C-doped oxides deposited, e.g., using spin-on glass (SOG) or CVD and having k=2.8-3.5 and H-doped oxides deposited, e.g., using SOG and having k=2.5-3.3. Organic materials include polyimides deposited, e.g., using spin on techniques and having k=3.0-4.0, aromatic polymers deposited, e.g., using spin on techniques and having k=2.6-3.2, and vapor-deposited Parylene or Parylene-F having k=2.7 or 2.3, respectively. Parylene is a trade name for a variety of chemical vapor deposited poly (p-xylylene) polymers. Organic materials also include F-doped amorphous carbon having k=2.3-2.8, and Polytetrafluoroethylene (PTFE) or TEFLON having 1.9-2.1. Highly porous oxides include xerogels and aerogels having k=1.0. An aerogel is obtained when the liquid phase of a gel is replaced by a gas in such a way that its solid network is retained with a shrinkage of less than, e.g., 15%. A xerogel is obtained when the liquid phase of a gel is removed by evaporation, with a shrinkage of more than, e.g., 90%. Another material which has a low dielectric constant is air, with k=1.

SiCN is also an example of a low-k material. Alternatives to silicon nitride films include silicon carbide film. One example is the BLOk™ (barrier low-k) film of APPLIED MATERIALS, INC.(R) This is a silicon carbide film based on the plasma-enhanced chemical vapor deposition of trimethylsilane and has k<3.0-4.5.

Other examples of low-k material include hydrogenated oxidized silicon carbon (SiCOH), fluorinated silicon oxide (SiOF) and carbon-incorporated silicon oxide (SiOC).

Step 812 includes performing slimming to remove the excess material. See, e.g., FIG. 10C. Step 813 includes depositing a blocking oxide, a charge-trapping layer, a tunnel oxide and a channel layer along the sidewalls of the memory holes, and depositing the dielectric core. See, e.g., FIGS. 9C and 10C.

FIG. 8C depicts another example process consistent with step 802*a* of FIG. 8A. Step 820 includes depositing a blocking oxide, a charge-trapping layer, a tunnel oxide and a channel layer along the sidewalls of the memory holes, and depositing the dielectric core. See, e.g., FIG. 12A. Step 821 includes etching a slit, e.g., an additional opening, in the stack. See, e.g., FIG. 9D. Step 822 includes providing an etchant in the slit to remove the sacrificial material (e.g., oxide) of the dielectric layers, exposing portions of the blocking oxide. See, e.g., FIGS. 9F and 12B. Step 823 includes providing a dopant in the slit to dope the exposed portions of the blocking oxide. The dopant can comprise carbon (C) or fluorine (F), for example, which are provided using a plasma doping process. The doping reduces the dielectric constant of the blocking oxide. See, e.g., FIG. 12C.

The sacrificial material of the dielectric layers may be removed after the sacrificial material of the control gate layers is removed and replaced by metal, in one approach.

In one option, step 824 includes providing an etchant in the slit to remove the doped portions of the blocking oxide layer. Doping the portions of the blocking oxide layer can make it easier to cleanly remove these portions, and avoid removing portions of the blocking oxide layer which span the control gates. See, e.g., FIG. 12D. Generally, doped block oxide can be removed using a wet or dry etching process. A wet etch uses a liquid-phase etchant such as diluted hydrofluoric acid. A dry etch uses a plasma-phase etchant. For example, the source gas for the plasma may comprise trifluoromethane. Example tools for a dry etch include Siconi™ process, chemical dry etching (CDE) and the Frontier™ system of Applied Materials, Inc. Siconi™ refers to a class of remote plasma assisted dry etch processes which involve the simultaneous exposure of a substrate to hydrogen- and fluorine-containing plasma effluents. Undoped block oxide can be removed using CDE.

Thus, one or more etchants are provided in the slit to remove the sacrificial oxide layers and the portions of the blocking oxide.

Step 825 includes leaving an air gap (void) in the dielectric layers and filling the slit. See, e.g., FIGS. 9H and 12D.

Figure 8D:
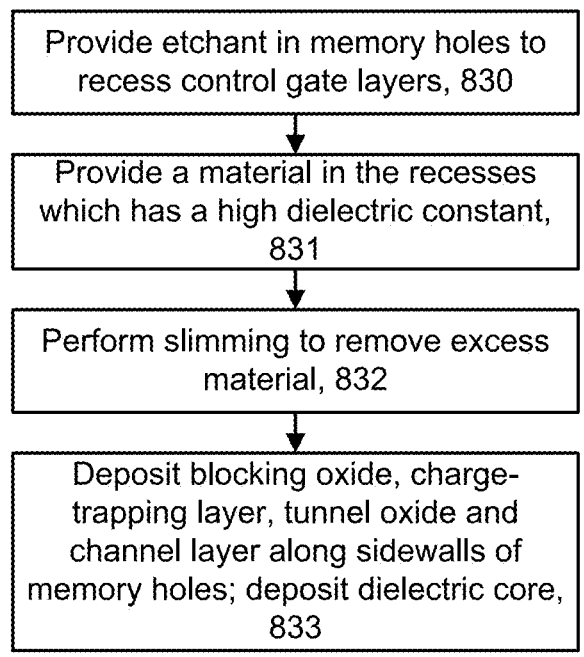
FIG. 8D depicts an example process consistent with step 802b of FIG. 8A.

FIG. 8D depicts an example process consistent with step 802*b* of FIG. 8A. Step 830 includes providing an etchant in the memory holes to recess the control gate layers. This etchant is more selective of the sacrificial material, e.g., SiN, of the control gate layers, than of the dielectric layer. See, e.g., FIG. 11A. Step 831 includes providing a material in the recesses which has a high dielectric constant. See, e.g., FIG. 11A. In one approach, a high dielectric constant (k) is k>7-10. One example is SiN, with k=7 when deposited using plasma-enhanced chemical vapor deposition PECVD. The dielectric constant of a material can vary depending on the method of deposition. Other high-k materials include aluminum oxide (AlO), zirconium oxide (ZrO2) and hafnium oxide (HfO2). The material can be deposited conformally using ALD. The material in the recess has a higher k than the material which it replaces.

Since the high-k material is selectively placed in the word line layers and acts as a block oxide, the total effective oxide thickness of the high-k block oxide and the medium-k (e.g., k=3.9) block oxide of the word line layers can be adjusted to optimize program and erase efficiency. A high-k material has a k value higher than a medium-k material, and a low-k material has a k value lower than the medium-k material, in one approach.

Step 832 includes performing slimming to remove the excess material. After the slimming process, a post-deposition anneal may be carried out for AlO (k=11-12) or other high-k oxides. Step 833 includes depositing a blocking oxide, a charge-trapping layer, a tunnel oxide and a channel layer along the sidewalls of the memory holes, and depositing the dielectric core. See, e.g., FIG. 11B.

Figure 9A:
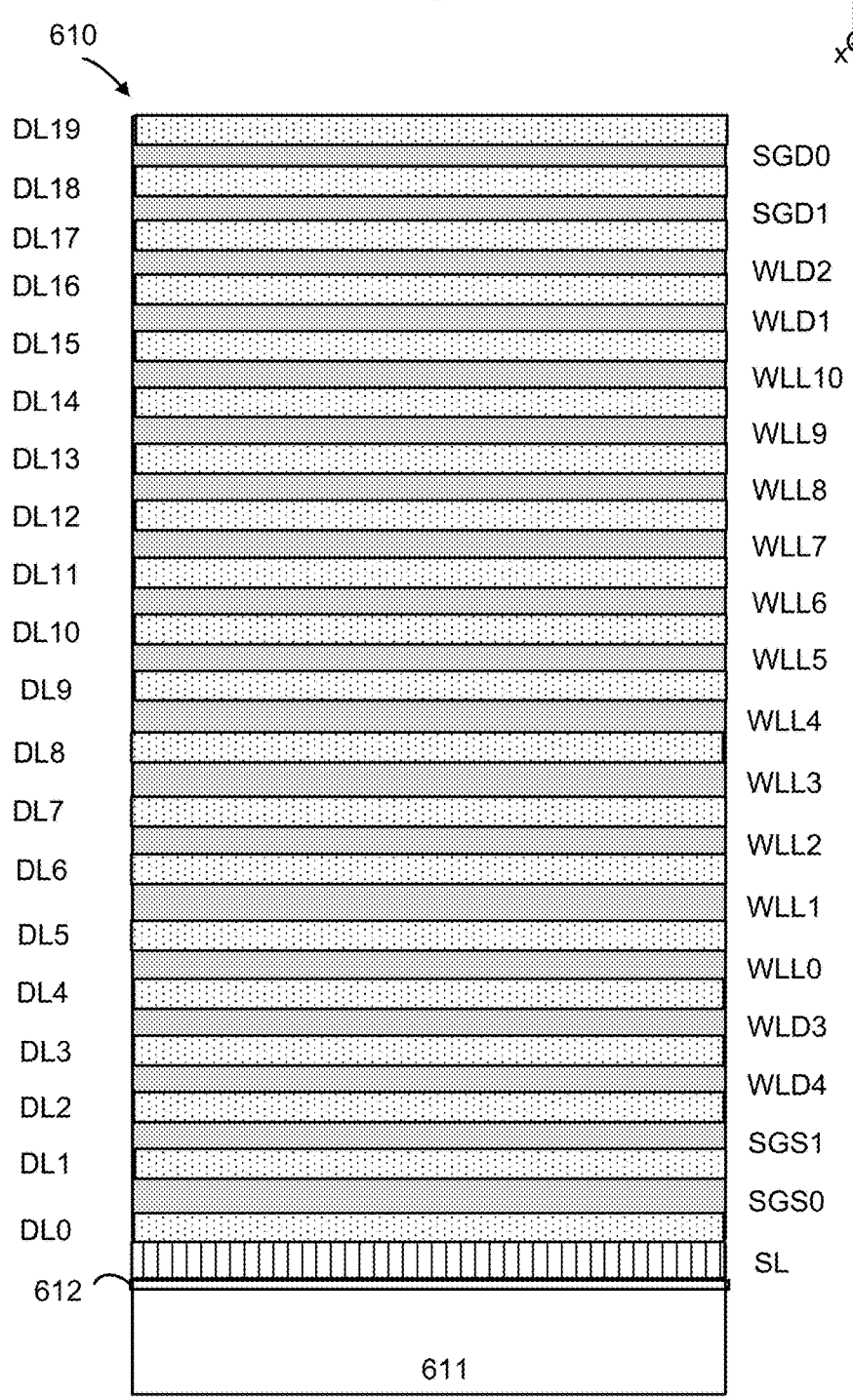
FIG. 9A depicts an example cross-sectional view of a stack of a memory device during a fabrication process consistent with step 800 of FIG. 8A, where the stack includes alternating dielectric and control gate layers.

FIG. 9A depicts an example cross-sectional view of a stack of a memory device during a fabrication process consistent with step 800 of FIG. 8A, where the stack includes alternating dielectric and control gate layers. The dielectric layers may comprise oxide and the control gate layers may comprise SiN, for example, at this stage. The stack includes a substrate 611 and an insulating film 612 on the substrate.

Figure 9B:
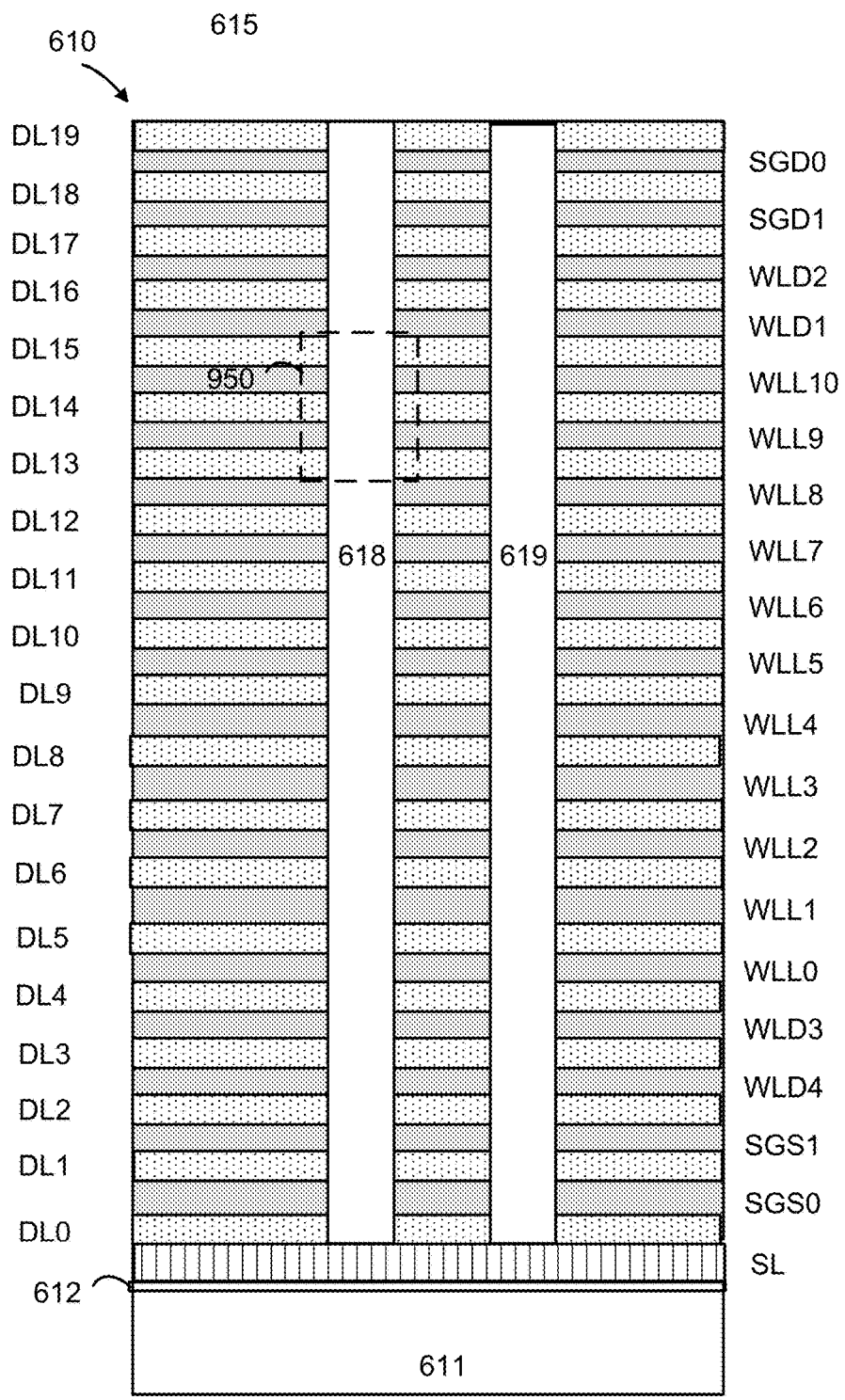
FIG. 9B depicts an example cross-sectional view of the stack of FIG. 9A after memory holes are formed, consistent with step 801 of FIG. 8A.

FIG. 9B depicts an example cross-sectional view of the stack of FIG. 9A after memory holes are formed, consistent with step 801 of FIG. 8A. A region 950 of the stack is discussed in FIG. 10A. The memory holes may be formed by etching.

Figure 9C:
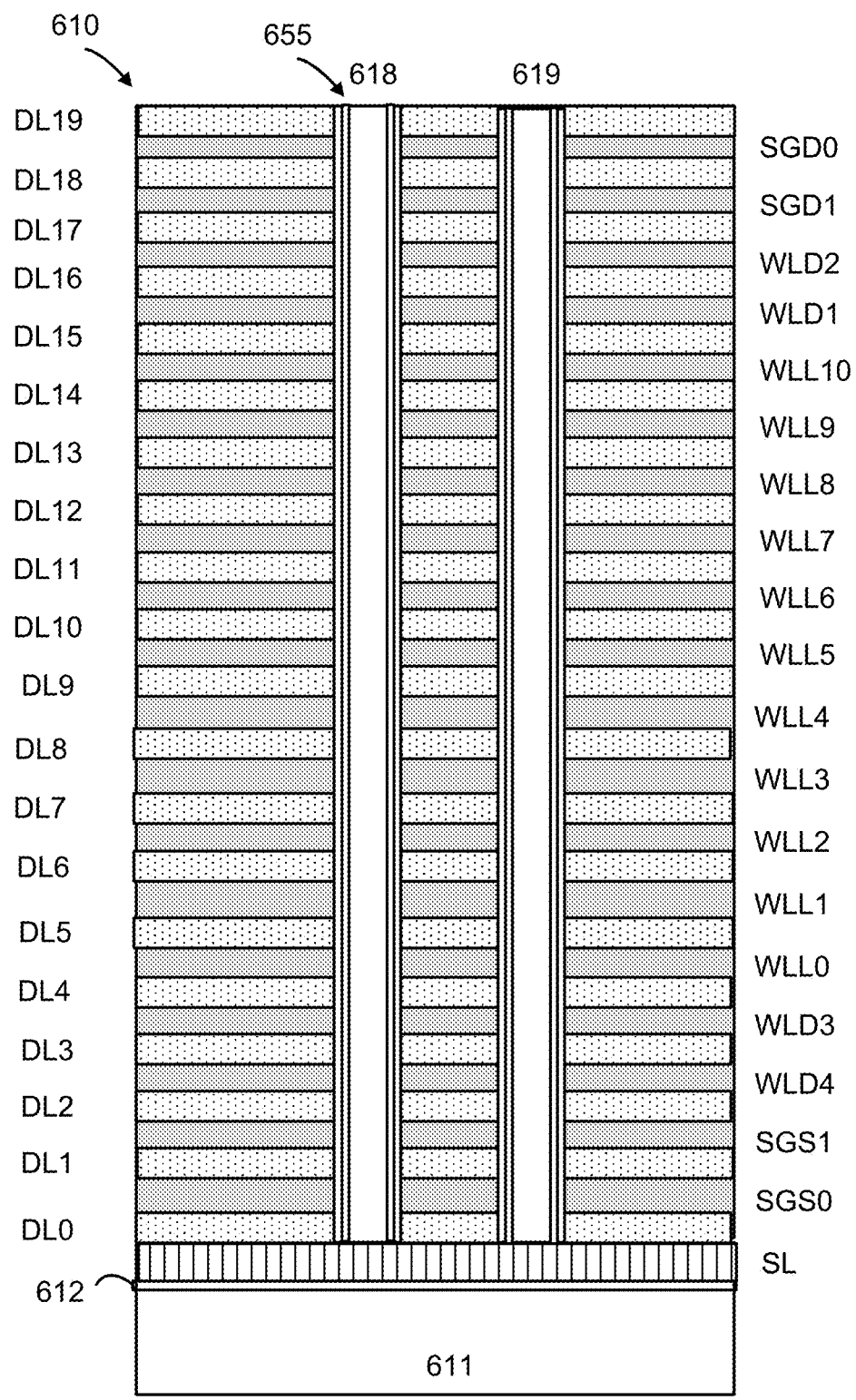
FIG. 9C depicts an example cross-sectional view of the stack of FIG. 9B after films 655 are deposited in the memory holes, consistent with step 802 of FIG. 8A.

FIG. 9C depicts an example cross-sectional view of the stack of FIG. 9B after films 655 are deposited in the memory holes, consistent with step 802 of FIG. 8A. The materials can include a blocking oxide layer, a charge-trapping layer, a tunneling layer, a channel layer and a dielectric core.

Figure 9D:
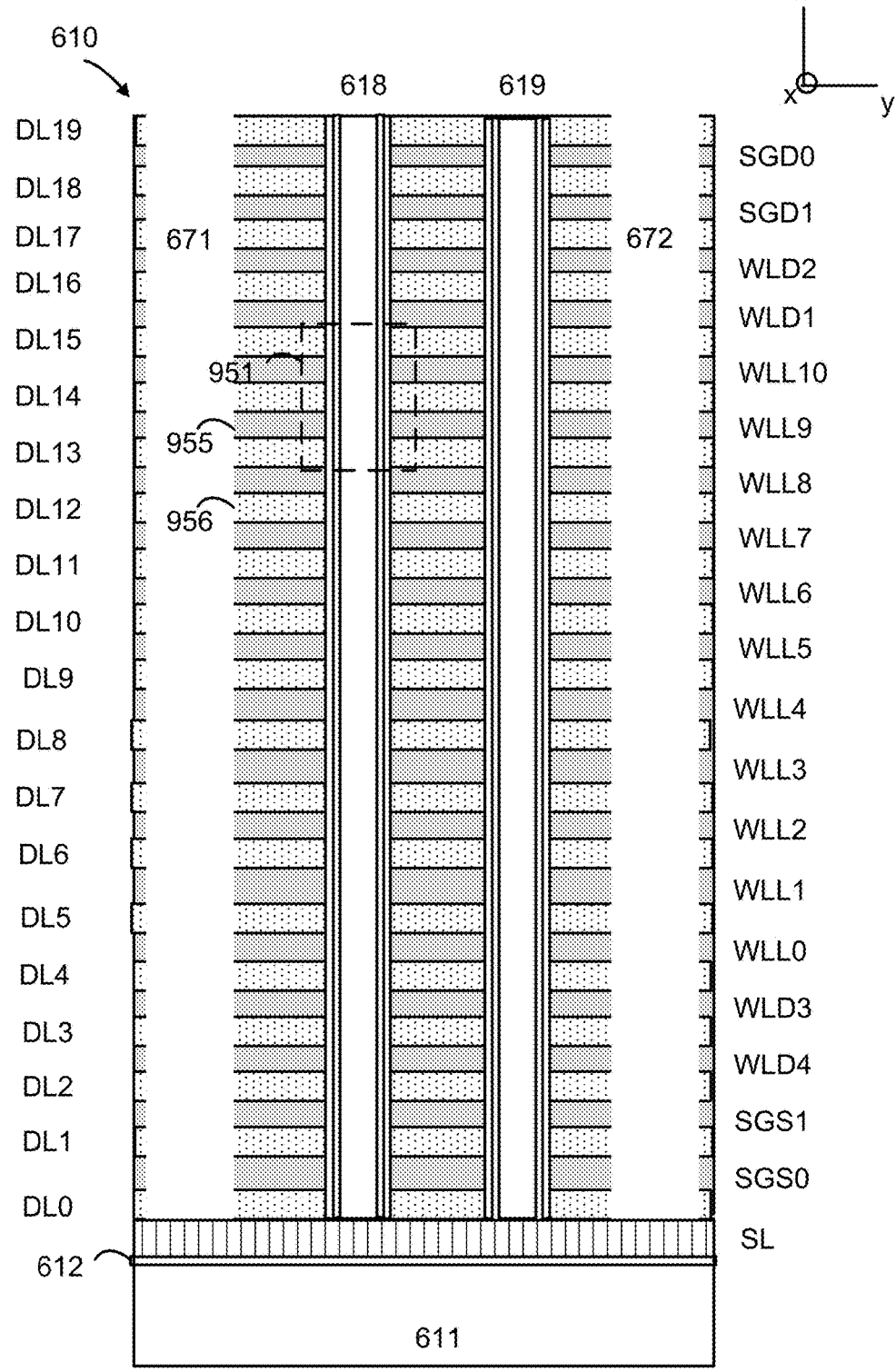
FIG. 9D depicts an example cross-sectional view of the stack of FIG. 9C after slits 671 and 672 are formed in the stack.

FIG. 9D depicts an example cross-sectional view of the stack of FIG. 9C after slits 671 and 672 are formed in the stack. The slits may be formed by etching and may extend along the z-axis and the x-axis along the stack. A region 951 of the stack is discussed in FIG. 12A. Sacrificial material 955 of the control gate layers is depicted. Sacrificial material 956 of the dielectric layers is also depicted.

Figure 9E:
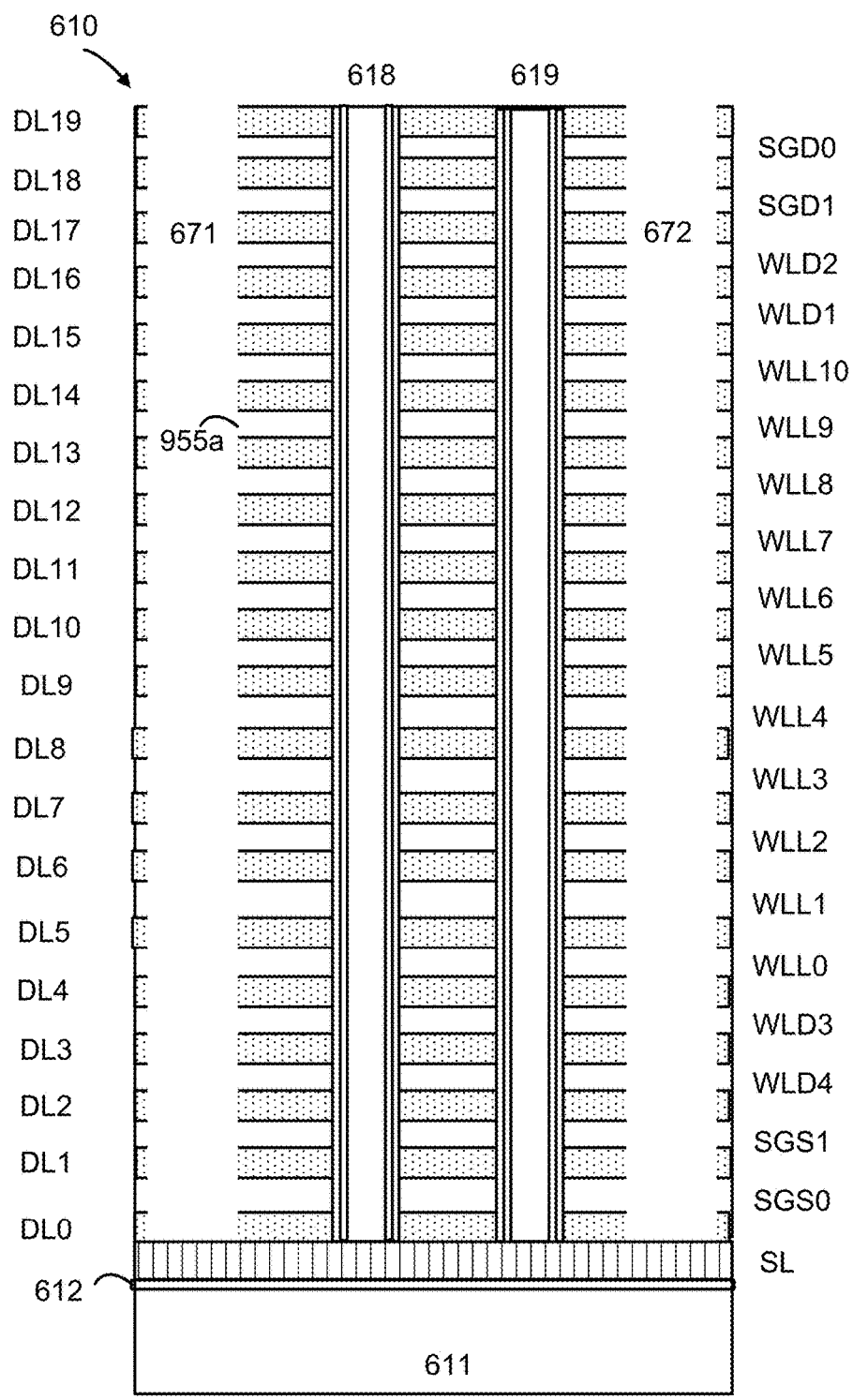
FIG. 9E depicts an example cross-sectional view of the stack of FIG. 9D after sacrificial material 955 of the control gate layers is removed by providing an etchant in the slit.

FIG. 9E depicts an example cross-sectional view of the stack of FIG. 9D after the sacrificial material 955 of the control gate layers is removed by providing an etchant in the slit. Voids 955*a* of the control gate layers are depicted.

Figure 9F:
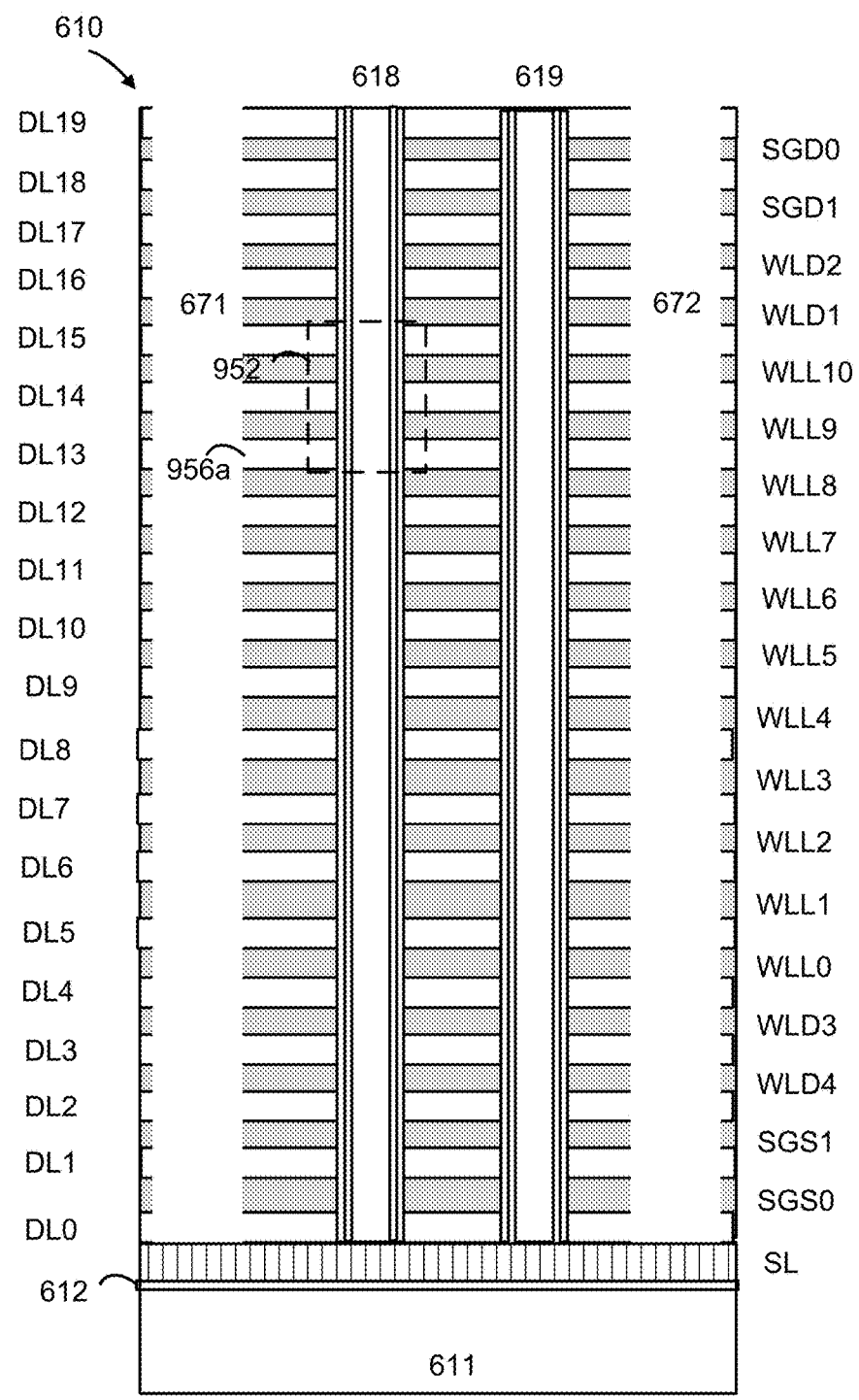
FIG. 9F depicts an example cross-sectional view of the stack of FIG. 9D after sacrificial material 956 of the dielectric layers is removed by providing an etchant in the slit.

FIG. 9F depicts an example cross-sectional view of the stack of FIG. 9D after sacrificial material 956 of the dielectric layers is removed by providing an etchant in the slit. Voids 956*a* of the dielectric layers are depicted. A region 952 of the stack is discussed in FIG. 12B.

Figure 9G:
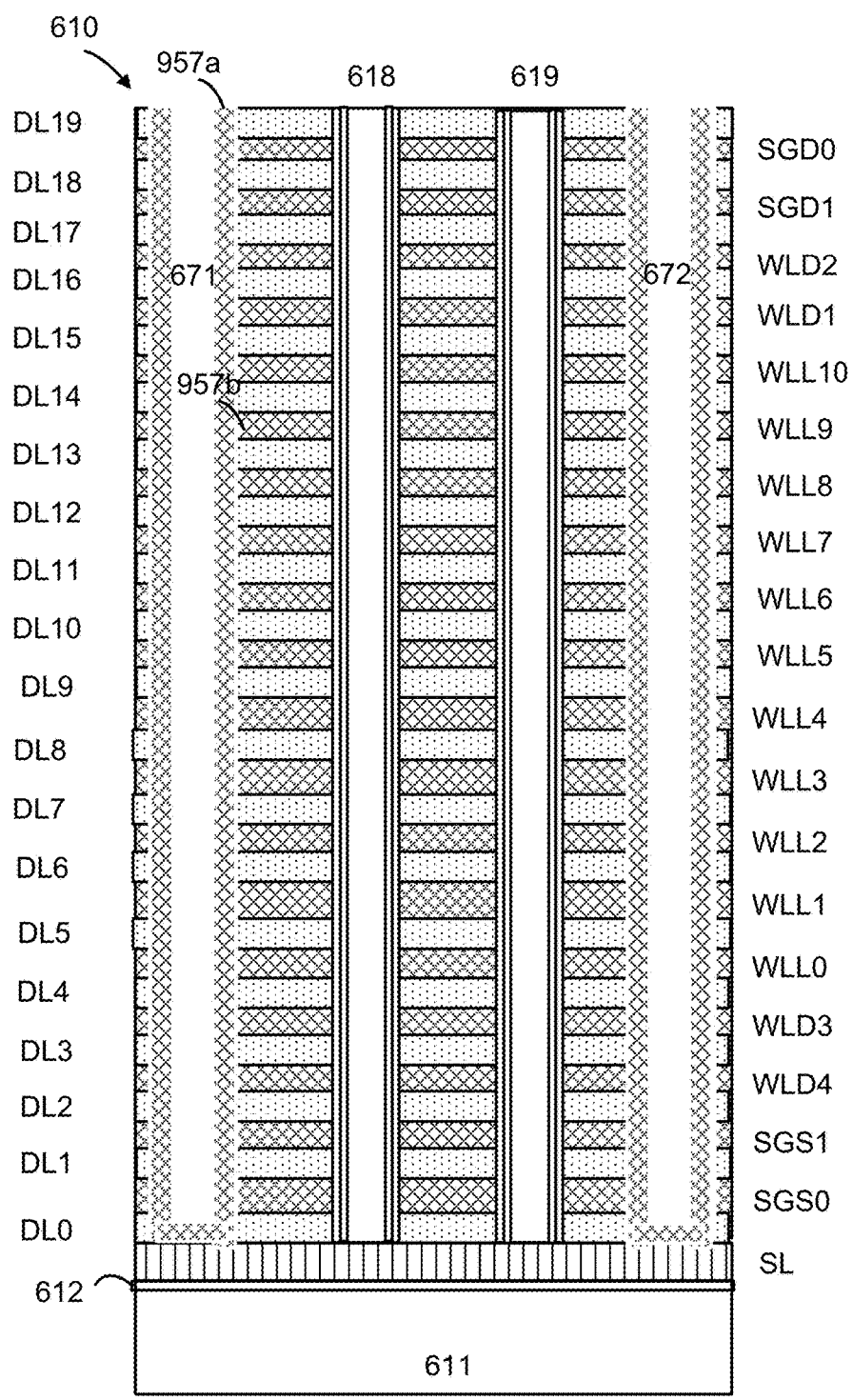
FIG. 9G depicts an example cross-sectional view of the stack of FIG. 9E after depositing a metal in the control gate layers via the slit.

FIG. 9G depicts an example cross-sectional view of the stack of FIG. 9E after depositing a metal in the control gate layers via the slit. The metal includes portions such as the portion 957*b* which fills the voids of the control gate layers, and a portion 957*a* which lines the slit.

FIG. 9H depicts an example cross-sectional view of the stack of FIG. 9G after cleaning and filling in the slit. The metal which lines the slit is cleaned away to avoid shorting the control gate layers. After the cleaning, a liner 958 such as $SiO_2$ is deposited in the slit and the bottom of the liner is etched through. An adhesion layer such as titanium nitride (TiN) may be deposited before the metal 959. The metal forms a continuous conductive path from a bottom of the stack to the top of the stack and can therefore act as a local interconnect. Interconnects 671*a* and 672*a* are formed.

FIG. 10A depicts the region 950 of the stack of FIG. 9B. The portion includes the dielectric layers DL13, DL14 and DL15 (including dielectric material 1006) and the control gates 691 and 690 in the word line layers WLL9 and WLL10, respectively. A sidewall SW of the memory hole is also depicted.

Figure 10B:
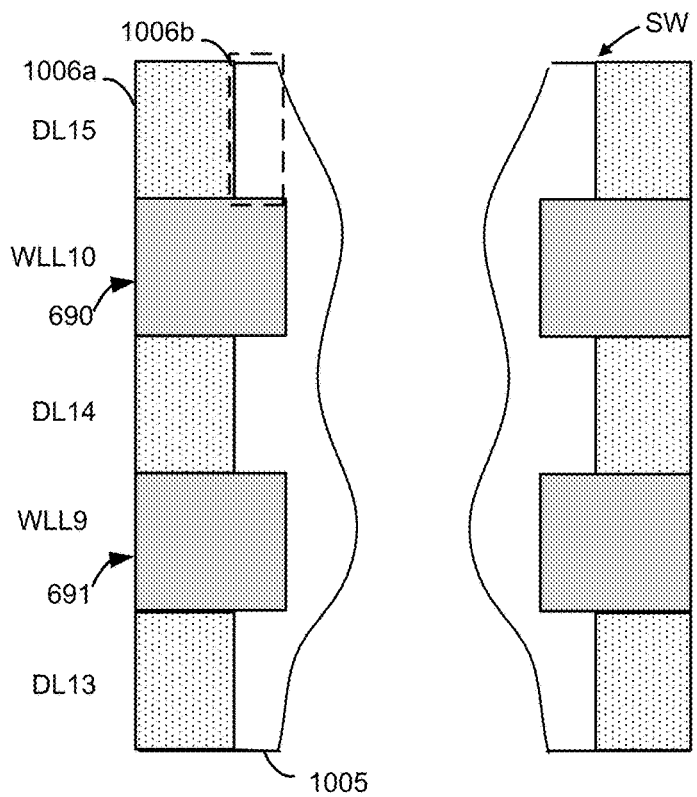
FIG. 10B depicts the region of the stack of FIG. 10A after forming recesses in the dielectric layers and depositing a low-k material in the memory hole, consistent with steps 810 and 811 of FIG. 8B, respectively.

FIG. 10B depicts the region of the stack of FIG. 10A after forming recesses in the dielectric layers and depositing a low-k material 1005 in the memory hole, consistent with steps 810 and 811 of FIG. 8B, respectively. The dielectric layers are recessed (etched back), e.g., including a recessed dielectric material 1006a, to form recesses, e.g., recess 1006b. The etch back (y2-y1 in FIG. 10C) could be 2-10 nm, for instance. The low-k material conforms to the shape of the sidewall, filling the recesses and covering the edges of the control gates which face the memory hole. In one example, the low-k material comprises doped oxide which is deposited by atomic layer deposition (ALD). Deposition by CVD is another option.

Figure 10C:
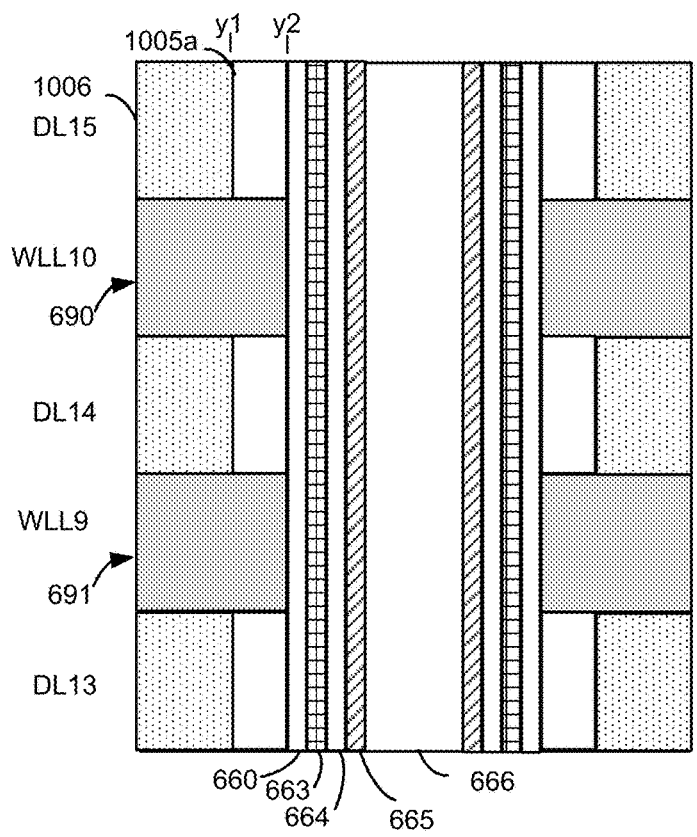
FIG. 10C depicts the region of the stack of FIG. 10B after a slimming step and depositing films along the sidewall of the memory holes, consistent with steps 812 and 813 of FIG. 8B, respectively.

FIG. 10C depicts the region of the stack of FIG. 10B after a slimming step and depositing films along the sidewall of the memory holes, consistent with steps 812 and 813 of FIG. 8B, respectively. The slimming step removes the excess low-k material to provide low-k regions adjacent to the dielectric layers, e.g., region 1005a. The low-k material which covers the control gates is also removed by the slimming. Subsequently, a blocking oxide layer 660 is deposited on the sidewall followed by a charge-trapping layer 663, a tunneling oxide layer 664, a channel layer 665 and a dielectric core 666. As mentioned, by using a low-k material between the control gate layers, in the path of the fringing electric field, the fringing electric field is more highly attenuated so that the problem of parasitic cells is reduced.

Figure 10D:
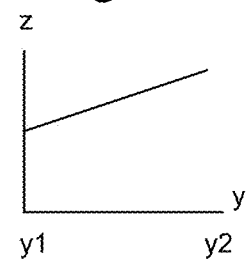
FIG. 10D depicts a plot of an example dopant concentration in the low-k material of FIG. 10C versus y-axis position.

FIG. 10D depicts a plot of an example dopant concentration in the low-k material of FIG. 10C versus y-axis position. The low-k regions have a width in the y direction which extends between y1 and y2. In one option, the dielectric constant of the low-k material in the recesses in the dielectric layers varies in a gradient such that the dielectric constant of the material is lower at portions of the material which are closer to the memory hole (e.g., at y2) than at portions of the material which are further from the memory hole (e.g., at y1). The gradient can be formed by changing the chemistry of the gas which is used to deposit the low-k material. For example, with SiCOH, SiOF and SiOC, a relatively higher proportion of H, F or C, respectively, results in a lower dielectric constant. A reason to have the lowest k value of the gradient at portions of the material which are closer to the memory hole is that all of the fringing electric field passes through these portions.

Figure 11A:
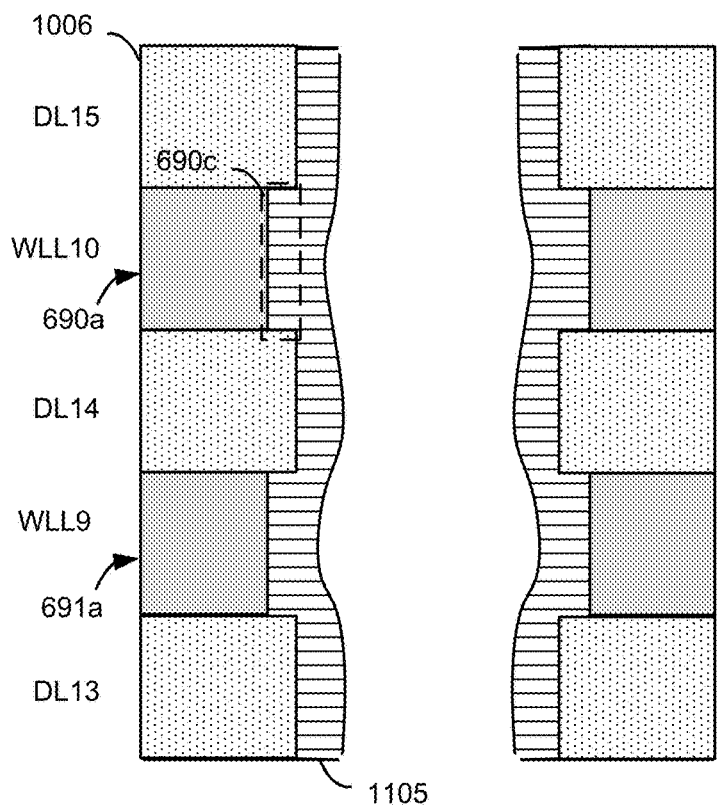
FIG. 11A depicts the region of the stack of FIG. 10A after forming recesses in the control gate layers and depositing a high-k material in the memory hole, consistent with steps 830 and 831 of FIG. 8D, respectively.

FIG. 11A depicts the region of the stack of FIG. 10A after forming recesses in the control gate layers and depositing a high-k material in the memory hole, consistent with steps 830 and 831 of FIG. 8D, respectively. Recessed control gates 690a and 691a are formed. Subsequently, a high-k material is deposited along the sidewall. The high-k material 1105 conforms to the shape of the sidewall, filling the recesses, e.g., recess 690c, and covering the edges of the dielectric layers which face the memory hole.

Figure 11B:
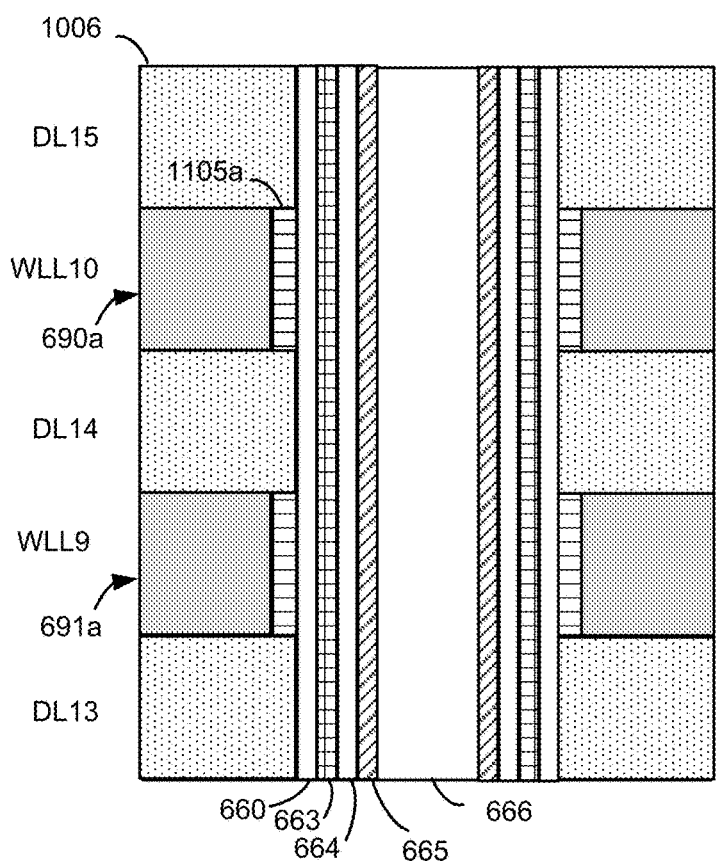
FIG. 11B depicts the region of the stack of FIG. 11A after a slimming step and depositing films along the sidewall of the memory holes, consistent with steps 832 and 833 of FIG. 8D, respectively.

FIG. 11B depicts the region of the stack of FIG. 11A after a slimming step and depositing films along the sidewall of the memory holes, consistent with steps 832 and 833 of FIG. 8D, respectively. The slimming step removes the excess high-k material to provide high-k regions adjacent to the word line layers, e.g., region 1105a. The high-k material which covers the dielectric layers is also removed by the slimming. Subsequently, a blocking oxide layer 660 is deposited on the sidewall followed by a charge-trapping layer 663, a tunneling oxide layer 664, a channel layer 665 and a dielectric core 666. By recessing the control gate, the distance that the fringing electric field has to travel to reach the channel is reduced, so that the formation of parasitic cells is weakened. Also, the fringing electric field travels a longer distance through the dielectric material 1006 so that its strength is reduced.

Figure 11C:
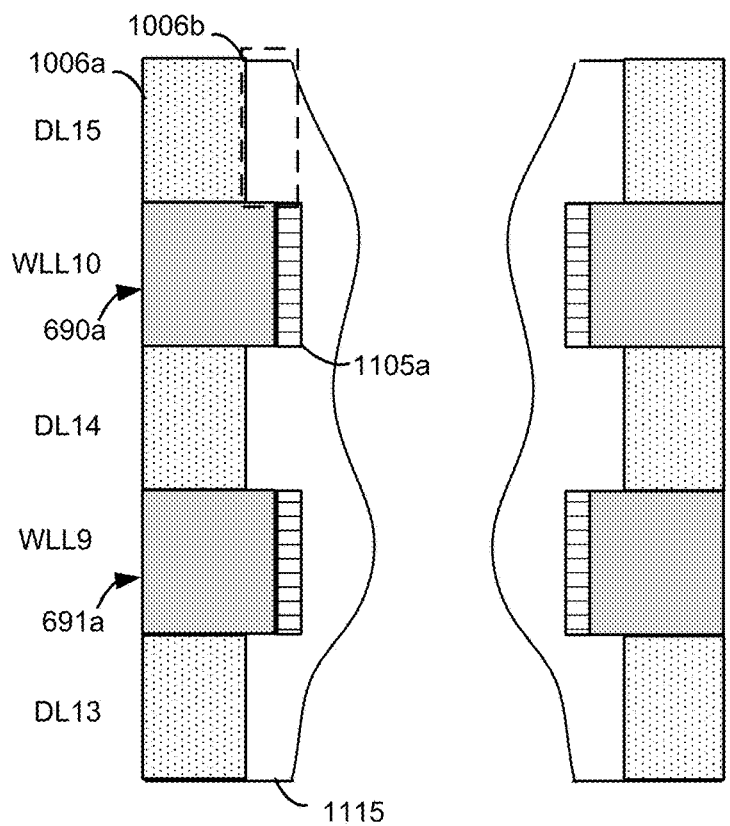
FIG. 11C depicts the region of the stack of FIG. 11A after a slimming step, and after forming recesses in the dielectric layers and depositing a low-k material in the memory hole, consistent with steps 810 and 811 of FIG. 8B, respectively.

FIG. 11C depicts the region of the stack of FIG. 11A after a slimming step, and after forming recesses in the dielectric layers and depositing a low-k material in the memory hole, consistent with steps 810 and 811 of FIG. 8B, respectively. In this option, the high-k regions adjacent to the word line layers, e.g., region 1105a, are provided as in FIG. 11B. However, the dielectric layers are also recessed and provided with low-k regions such as in FIG. 10C. This occurs before providing the blocking oxide layer 660, charge-trapping layer 663, tunneling oxide layer 664, channel layer 665 and the dielectric core 666. The low-k material 1115 conforms to the shape of the sidewall, filling the recesses, e.g., recess 1006b, and covering the high-k material of the control gate layers.

Figure 11D:
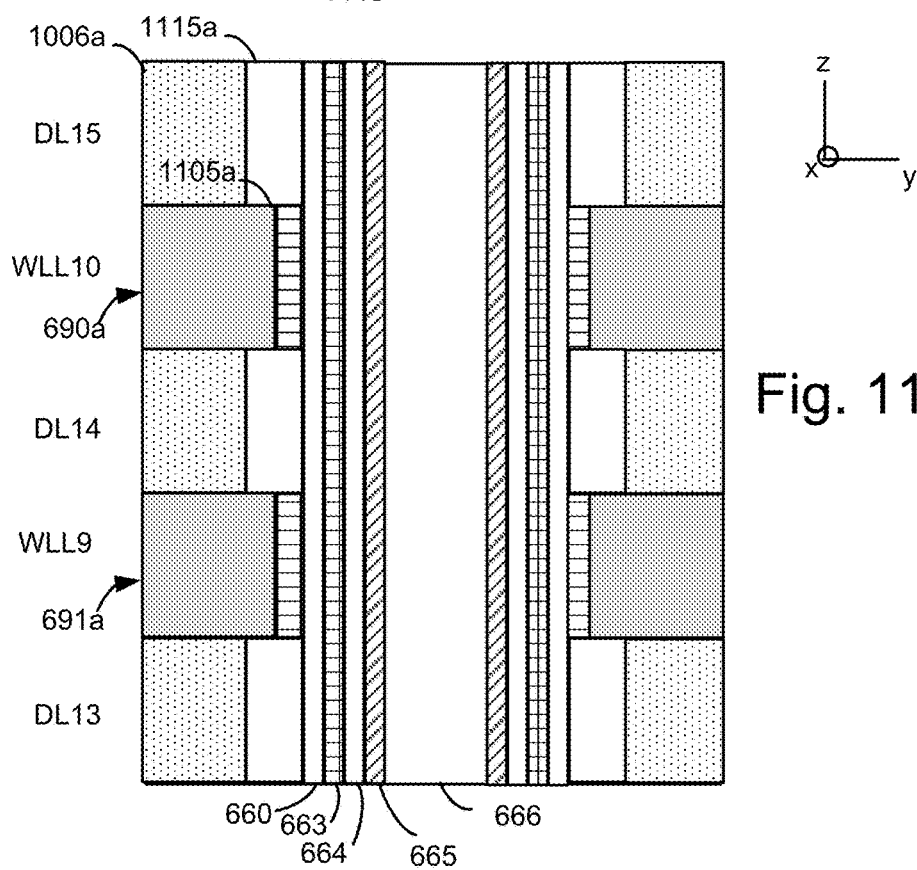
FIG. 11D depicts the region of the stack of FIG. 11C after a slimming step and depositing films along the sidewall of the memory holes, consistent with steps 812 and 813 of FIG. 8B, respectively.

FIG. 11D depicts the region of the stack of FIG. 11C after a slimming step and depositing films along the sidewall of the memory holes, consistent with steps 812 and 813 of FIG. 8B, respectively. The slimming step removes the excess low-k material to provide low-k regions adjacent to the dielectric layers, e.g., region 1115a. The low-k material which covers the high-k material is also removed by the slimming. Subsequently, a blocking oxide layer 660 is deposited on the sidewall followed by a charge-trapping layer 663, a tunneling oxide layer 664, a channel layer 665 and a dielectric core 666.

In one approach, the low-k region 1115a is thicker (y-axis dimension) than the high-k region 1105a. The thickness of the high-k region may be limited to avoid a substantial increase in the distance between the control gate and the channel and a corresponding reduction of the gate-to-channel voltage which is relevant in programming of the cell.

Figure 12A:
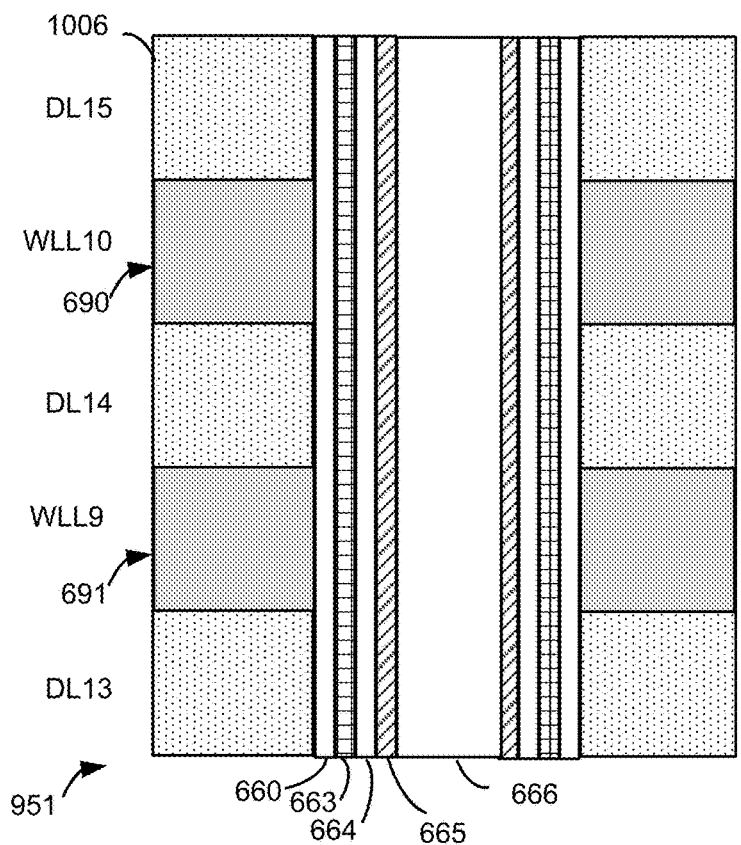
FIG. 12A depicts the region 951 of the stack of FIG. 9D.

FIG. 12A depicts the region 951 of the stack of FIG. 9D. The portion includes the dielectric layers DL13, DL14 and DL15 (including dielectric material 1006) and the control gates 691 and 690 in the word line layers WLL9 and WLL10, respectively. Also provided are a blocking oxide layer 660, a charge-trapping layer 663, a tunneling oxide layer 664, a channel layer 665 and a dielectric core 666.

Figure 12B:
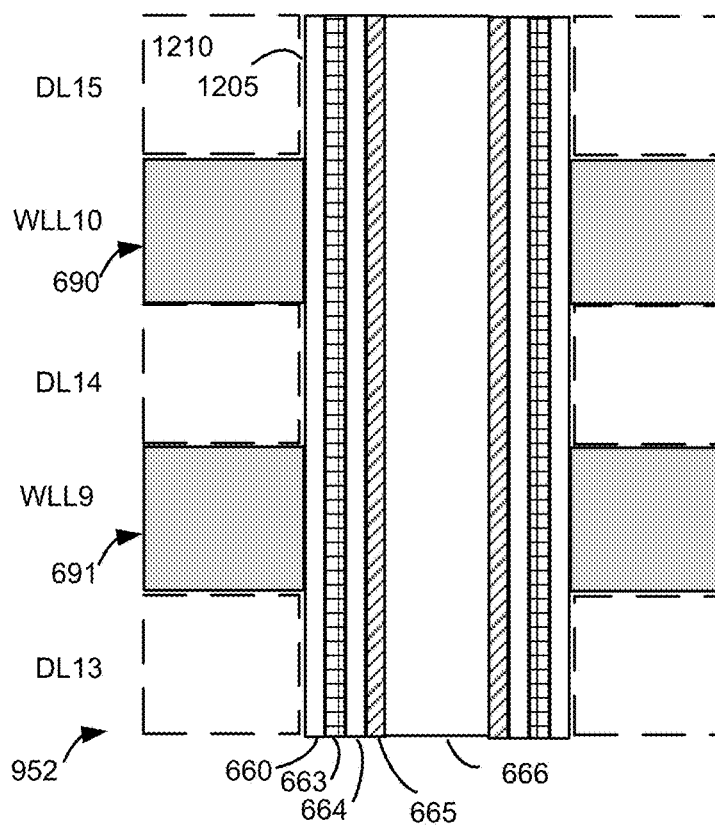
FIG. 12B depicts the region 952 of the stack of FIG. 9E.

FIG. 12B depicts the region 952 of the stack of FIG. 9E. The dielectric material of the dielectric layers has been removed such that voids, e.g., void 1210, are formed in the dielectric layers and a portion, e.g., portion 1205 of the blocking oxide layer 660 is exposed.

FIG. 12C depicts the region of the stack of FIG. 12B after the doping step 823 of FIG. 8C. The doping provides doped blocking oxide portions, e.g., portion 1205a, of the blocking oxide layer 660. The doped blocking oxide portion spans a height of the dielectric layer. In this approach, medium-k oxide portions 690b are provided adjacent to the control gates and low-k portions, e.g., portion 1205a, are provided adjacent to the dielectric layers, between neighboring control gates. The voids of the dielectric layers can optionally be filled or left as voids to improve the word line RC delay.

FIG. 12D depicts the region of the stack of FIG. 12C after the etching step 824 of FIG. 8C. The etching removes the doped portions of the blocking oxide layer to provide voids, e.g., voids 1205b. In this approach, the oxide of the dielectric layers is selectively removed via the slit. This may occur after a replacement of the sacrificial nitride of the word line layers. Portions of the block oxide layer are then doped, e.g., plasma doping with C or F. As a result, the medium-k block oxide remains adjacent to the control gate layers while a doped oxide is formed in the space region between neighboring control gates, as shown in FIG. 12C. The doped oxide is then selectively removed by a dry etch process, for instance. As a result, the discrete medium-k oxide regions adjacent to the control gate layers are separated by voids 1205b, with k=1.

An advantage of this approach is that the low possible k value is achieved by providing a void 1205b between the control gates and in the path of the fringing electric field.

Accordingly, it can be seen that, in one embodiment, a method comprises: forming a stack of alternating dielectric layers and control gate layers; forming a memory hole which extends through the alternating dielectric layers and control gate layers, the memory hole comprising a sidewall; providing a blocking oxide along the sidewall, adjacent to the control gate layers; and reducing a dielectric constant of a fringing electric field path of the control gate layers.

In another embodiment, an apparatus comprises: a stack of alternating dielectric layers and control gate layers; concentric films which extend through the alternating dielectric layers and control gate layers, wherein the concentric films comprises an oxide film adjacent to the control gate layers and the dielectric layers, a charge-trapping film, one or more tunneling layers and a polysilicon channel film; and regions between the control gate layers, adjacent to the oxide film, wherein a dielectric constant of the regions between the control gate layers is lower than a dielectric constant of the oxide film.

In another embodiment, a method comprises: forming a stack of alternating sacrificial oxide layers and sacrificial nitride layers; forming a memory hole which extends through the alternating sacrificial oxide layers and sacrificial nitride layers, the memory hole comprising a sidewall; providing an oxide layer along the sidewall; forming an additional opening in the stack; providing an etchant in the additional opening to remove the sacrificial oxide layers and expose portions of the oxide layer; and via the additional opening, doping the portions of the oxide layer using a dopant which reduces a dielectric constant of the portions of the oxide layer.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method, comprising:
forming a stack of alternating dielectric layers and control gate layers;
forming a memory hole which extends through the alternating dielectric layers and control gate layers, the memory hole comprising a sidewall;
providing an etchant in the memory hole to etch back the dielectric layers to form recesses in the dielectric layers adjacent to a recessed dielectric material of the dielectric layers;
depositing a low-k material in the memory hole, the low k material having a dielectric constant which is lower than a dielectric constant of the dielectric layers, and the low-k material conforms to a shape of the sidewall by filling the recesses and covering edges of the control gates layers which face the memory hole;
perform slimming to remove excess portions of the low-k material in the memory hole; and
after the slimming, depositing a continuous blocking oxide layer along the sidewall.

2. The method of claim 1, wherein:
the low-k material comprises at least one of an F-doped oxide, a C-doped oxide or an H-doped oxide.

3. The method of claim 1, wherein:
the low-k material comprises an organic material.

4. The method of claim 1, wherein:
the low-k material comprises at least one of an aerogel or a xerogel.

5. The method of claim 1, further comprising:
changing a chemistry of a gas during deposition of the low-k material in the recesses in the dielectric layers such that the dielectric constant of the low-k material is lower at portions of the low-k material which are closer to the memory hole than at portions of the low-k material which are further from the memory hole.

6. The method of claim 1, further comprising:
after the depositing the continuous blocking oxide layer along the sidewall, providing a charge-trapping film, one or more tunneling layers and a polysilicon channel film in the memory hole.

7. The method of claim 1, wherein:
the low-k material has a dielectric constant which is lower than a dielectric constant of the continuous blocking oxide layer.

8. The method of claim 1, wherein:
the slimming removes portions of the low-k material which cover the control gate layers so that portions of the low-k material which fill the recesses are separated from one another by the control gate layers.

9. The method of claim 1, further comprising:
providing an etchant in the memory hole to form recesses in the control gate layers; and
providing a high-k material in the recesses in the control gate layers having a dielectric constant which is higher than a dielectric constant of the control gate layers.

10. The method of claim 9, wherein:
the high-k material comprises at least one of aluminum oxide, zirconium oxide or hafnium oxide.

11. The method of claim 9, wherein:
the high-k material has a dielectric constant which is higher than a dielectric constant of the continuous blocking oxide layer.

12. The method of claim 9, wherein:
the low-k material is thicker than the high-k material.

13. The method of claim 9, further comprising:
perform slimming to remove, from the memory hole, excess portions of the high-k material.

14. A method, comprising:
forming a stack of alternating sacrificial oxide layers and sacrificial nitride layers;
forming a memory hole which extends through the alternating sacrificial oxide layers and sacrificial nitride layers, the memory hole comprising a sidewall;
depositing an oxide layer along the sidewall, wherein the oxide layer comprises first portions which span heights of the sacrificial oxide layers but not heights of the sacrificial nitride layers and second portions which span heights of the sacrificial nitride layers but not heights of the sacrificial oxide layers;
forming an additional opening in the stack;
providing an etchant in the additional opening to remove the sacrificial oxide layers and expose the first portions of the oxide layer; and
via the additional opening, doping the first portions of the oxide layer to provide doped portions of the oxide layer; and
after the doping, providing an etchant in the additional opening to remove the doped portions of the oxide layer, leaving voids which separate the second portions.

15. The method of claim 14, wherein:
the doping uses a dopant comprising at least one of carbon or fluorine.

16. The method of claim 14, wherein:
the additional opening comprises a slit in the stack.

17. The method of claim 14, further comprising:
replacing the sacrificial nitride layers with metal before the removing of the sacrificial oxide layers.

18. The method of claim 14, further comprising:
before the removing of the sacrificial oxide layers, and after the depositing the oxide layer along the sidewall, providing a charge-trapping film, one or more tunneling layers and a polysilicon channel film in the memory hole.

19. A method, comprising:
forming a stack of alternating dielectric layers and control gate layers;
forming a memory hole which extends through the alternating dielectric layers and control gate layers, the memory hole comprising a sidewall;
providing an etchant in the memory hole to etch back the control gate layer to form recesses adjacent to a recessed material of the control gate layers;
depositing a high-k material in the memory hole, the high-k material having a dielectric constant which is higher than a dielectric constant of the control gate layers, and the high-k material conforms to a shape of the sidewall by filling the recesses and covering edges of the dielectric layers which face the memory hole;
perform slimming to remove excess portions of the high-k material in the memory hole; and
after the slimming, depositing a continuous blocking oxide layer along the sidewall.

20. The method of claim 19, further comprising:
after the depositing the continuous blocking oxide layer along the sidewall, providing a charge-trapping film, one or more tunneling layers and a polysilicon channel film in the memory hole.

* * * * *